United States Patent
Stiens et al.

(10) Patent No.: US 7,193,202 B2
(45) Date of Patent: Mar. 20, 2007

(54) PHOTOVOLTAGE DETECTOR

(75) Inventors: Johan Stiens, Brussels (BE); Gennady Shkerdin, Moscow (RU); Vladimir Kotov, Moscow (RU)

(73) Assignee: Vrije Universiteit Brussel, Brussels (BE)

( * ) Notice: Subject to any disclaimer, the term of this patent is extended or adjusted under 35 U.S.C. 154(b) by 203 days.

(21) Appl. No.: 10/949,120

(22) Filed: Sep. 23, 2004

(65) Prior Publication Data
US 2006/0060754 A1 Mar. 23, 2006

(51) Int. Cl.
*H01L 31/00* (2006.01)

(52) U.S. Cl. .............. 250/214.1; 250/338.4; 257/434

(58) Field of Classification Search ........... 250/214.1, 250/338.1, 338.4; 257/434, 435
See application file for complete search history.

(56) References Cited

U.S. PATENT DOCUMENTS

| 3,624,542 A | 11/1971 | Pugh |
| 4,243,888 A | 1/1981 | Gruhn |
| 5,623,509 A * | 4/1997 | Iwano et al. ............. 372/45.01 |
| 2002/0042831 A1 | 4/2002 | Capone |
| 2003/0164450 A1 | 9/2003 | Bruchhaus |

* cited by examiner

*Primary Examiner*—Kevin Pyo
(74) *Attorney, Agent, or Firm*—Barnes & Thornburg LLP

(57) ABSTRACT

A method and system for detecting and monitoring a temporal and spatial distribution of a light beam are provided. A semiconductor substrate (120) having a given doping concentration range is partially exposed to an incident laser beam (150). Each part of the semiconductor structure (120) which is exposed to the laser beam is provided with an electrical contact (145), which outputs a voltage which is directly related to the optical power or energy incident on the exposed area. The thermo-voltage is produced by the laser induced thermal gradients. The sensitivity and inter-pixel cross-talk is determined by pixel pitch, doping concentration and window opening (110). Depending of the design, each pixel might be sensitive to the temporal variation of the laser beam.

24 Claims, 15 Drawing Sheets

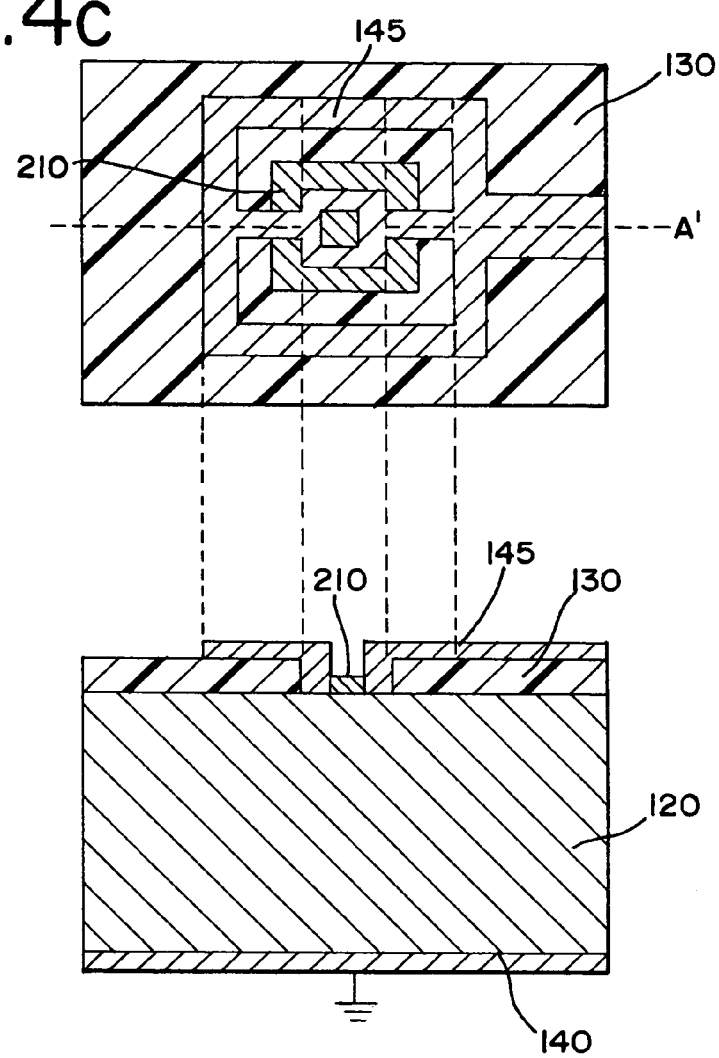
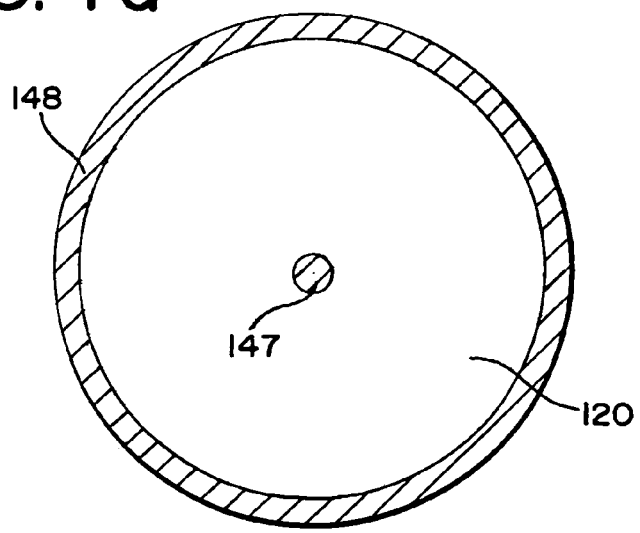

PHOTOVOLTAGE DETECTOR

TECHNICAL FIELD OF THE INVENTION

The present invention relates to methods and systems for measuring and/or monitoring the temporal and spatial profile of high power laser beams in high optical power applications.

BACKGROUND OF THE INVENTION

Conceiving detectors and/or cameras, which can monitor the spatial and temporal distribution of powerful $CO_2$ laser beams, is an important issue for industrial $CO_2$ laser applications. Beam monitoring is needed for pulsed laser applications, i.e. with a pulse width ranging from picoseconds to milliseconds, as well as for continuous wave (CW) applications. Beam diagnostics prevent laser based industrial processes of going unexpectedly down for some while. In general the laser beam quality deteriorates in time due to laser-induced damage of optical components in the setup or due to thermally induced misalignments in the set-up.

Two fundamental detection mechanisms can be distinguished. Energy detectors respond to temperature changes generated by the incident IR radiation through changes in material properties. Photon detectors generate free electrical carriers through the interaction of photons and bound electrons. Energy detectors are low cost and typically used in single detector applications. However, the simplicity of fabricating large 2D focal plane arrays in semiconductors has lead to the use of photon detectors in almost all advanced IR detection systems. Examples of photon detectors are the quantum-well and quantum-dot infrared detectors, photoconductive and photovoltaic detectors. Energy detectors contain two elements, an absorber and a thermal transducer. Examples are pyroelectric detectors, ferro-electric detectors and thermistors and bolometers. Pyroelectric and ferroelectric detectors comprise a polarized material which when subjected to changes in temperature changes its polarization. In thermistors the resistance of the elements varies with temperature. An example of a thermistor is a bolometer.

In continuous wave (CW) regime, problems arise already with existing commercial detectors, such as photo-electromagnetic (PEM), pyroelectric detectors (PE), for beam powers larger than about 30 W. The sensitivity of existing CW detectors (PE, PEM), . . . can be quite high at low optical powers, i.e. several thousands of VAN, but at higher optical inputs two phenomena yield a strong degradation of the detectors output. At first there is tremendous non-linearity in the electrical output when the optical input increases, the sensitivity can degrade with several orders of magnitude when the input also changes with some orders of magnitude, hence these detectors have a very limited dynamic range. Secondly, beyond some optical power level thermal damage occurs due to their limited thermal evacuation and due to the very local absorption process. In pulsed applications the optical power density can be very high and commercial detectors completely fail to detect these optical power levels. At high optical power levels, i.e. larger than 1 $MWcm^{-2}$, there is no viable available detector/camera as the existing commercial devices loose their sensitivity at high optical power levels by several orders of magnitude in pulsed applications.

In general it can be said that most of the aforementioned detectors are used to collect the energy emitted by all kind of heated objects. The detected energy is translated into imagery showing the energy difference between objects, thus allowing an otherwise obscured scene to be visualised. Typical applications of these cameras are for thermal imaging, night vision camera, automotive, fire fighting, electronics thermal inspection, and industrial process monitoring.

Consequently, there is a need for the development of novel detector types for the market of laser beam profiling, withstanding much higher power levels. Several systems, used for positioning or measuring power output of lasers are already known.

U.S. Pat. No. 3,624,542 describes a method for checking the luminous power output of a laser comprising a beam splitter. A portion of the laser beam is directed towards a temperature sensitive device. The device is made of a heat-receiving cone which collects a fraction of the beam and directs it to a thermocouple setup. A variation in the laser output leads to a variation in electrical output, which allows continuously monitoring and providing feedback for the output of a laser. The document nevertheless only describes a method for controlling the power output of a light beam, it does not allow to control a light beam profile as it does not provide spatial information. No extension towards array configuration is possible.

Patent application US 2001/0042831 A1 describes a photon detector whereby thin films are deposited on a substrate and whereby the absorption, detection and removal of the generated photon heat is performed in thin films. Nevertheless for real high power systems, the possibility that thermal and mechanical damage occurs is significantly large. In a similar way, patent application US 2003/0164450 A1 describes a method and system for detecting thermal radiation, whereby thin film detector elements are used. Furthermore, US 2003/0164450 A1 describes the use of focussing elements which also is not advantageous if high power laser systems are used.

In patent application U.S. Pat. No. 4,243,888 describes a system for laser beam alignment having a detector disc which is disposed in the laser beam path. The incident laser beam creates thermoelectric effects in the detector which yields voltage signals induced by pulsed heat diffusion. The voltage signals are collected in a short period and integrated to determine the position of the beam and to correct this position if necessary. U.S. Pat. No. 4,243,888 does not provide a device or method for studying the profile of the laser beam light.

The problems with the prior art methods and systems is that they do not allow detection in real high power laser systems as they incorporate thin film detectors or detection systems positioned directly in the laser beam path. Furthermore, most of the systems have the disadvantage that they only allow to monitor the output power of the laser or provide a means for aligning the laser beam.

SUMMARY OF THE INVENTION

It is an object of the present invention to provide a method and system for monitoring/recording the optical power or energy of laser beams with its temporal evolution and monitoring/recording the spatial profiles of the laser beam with their temporal evolution.

The above objective is accomplished by a method and device according to the present invention.

The invention relates to a detector for characterising a high power light beam, said detector comprising at least one pixel, wherein each of said at least one pixel comprising a doped semiconductor substrate adapted to substantially absorb an incident light beam, being at least a fraction of said high power light beam, over a penetration depth $L_{abs}$, said semiconductor substrate having thermoelectric properties means for measuring an electrical signal induced by a thermoelectric effect in said doped semiconductor substrate, said means partly covering the doped semiconductor substrate such that a window opening is provided at a first side of said doped semiconductor substrate for receipt of said incident light beam in said doped semiconductor substrate and said means comprising a first electrode at said first side of said doped semiconductor substrate and a reference electrode, positioned outside an absorption volume determined by said window opening and said penetration depth $L_{abs}$. The means for partly covering the doped semiconductor substrate and said penetration depth $L_{abs}$ may be adjusted so that $$\frac{P_{pixel} \cdot L_{abs}}{S_{pixel}}$$

is in the range 0.1 to 100 wherein $P_{pixel}$ is the perimeter of the pixel window and $S_{pixel}$ is the surface area of the pixel window. The penetration depth $L_{abs}$ for the light beam in said doped semiconductor substrate may furthermore be adjusted to keep the temperature of the surface of said doped semiconductor substrate in said window opening below a maximum temperature, said penetration depth $L_{abs}$ being bounded by $$K \cdot \frac{t_{pulse} \cdot W_0}{C \cdot L_{abs}} > T_{max}$$

with K a proportional factor, $t_{pulse}$ being the pulse width, $W_0$ being the incident laser intensity and C being the heat capacity of the doped semiconductor substrate. The penetration depth $L_{abs}$ for the light beam in said doped semiconductor substrate may furthermore be adjusted to keep the temperature of the surface of said doped semiconductor substrate in said window opening below a maximum temperature, said penetration depth $L_{abs}$ being bounded by $$T_{surface,max} = W_0 \min\{L_{beam}, L_{pix}\}^2 / ((L_{abs} + \min\{L_{beam}, L_{pix}\})\chi)$$

with K a proportional factor, $W_0$ being the incident laser intensity and $L_{beam}$ and $L_{pix}$ are the laser beam width and the window width of a pixel element. The proportional factor K lies in the range 0.1 to 10, preferably in the range 0.3 to 7, more preferably in the range 0.5 to 5, even more preferably in the range 0.5 to 3. Characterising said high power light beam may be any of detecting a spatial intensity profile, a spatial energy profile, a spatial energy density profile or a spatial power profile of the high power light beam. The first electrode may be defining at least the perimeter of the window opening. The first electrode furthermore may comprise at least one elongate electrode extending over the window opening. The second electrode may be positioned at a second side of the doped semiconductor substrate, the first and second side being opposite with respect to each other. The first electrode is separated at least partly from said doped semiconductor substrate by means of an insulating layer. The first electrode furthermore may comprise a conductor line and a bonding pad, deposited on top of said insulating layer. A reflective top layer may be provided outside said window opening. The reflective top layer may be provided on top of the first insulating layer and complementary isolated from all the metal conductor lines. A second insulating layer in combination with a reflective top layer may be provided on top of the first insulating layer and all the metal conductor lines, except on the bonding pads and detector openings. A third set of electrical contacts may be provided, covered by a reflective or absorptive layer, such that light is not incident in the direct neighbourhood of these contacts such that this set of contacts sense the optically induced temperature distribution of these parts of the substrate which are not directly exposed to the incident laser beam. The adjustment of the penetration depth $L_{abs}$ may be performed by adjusting the doping level of said doped semiconductor substrate. The detector may comprise a plurality of pixels, each pixel having a pixel window with an average pixel window width w, the pixels being separated by at least an interpixel pitch P, wherein said interpixel pitch P may be between 1 and 10 times the average pixel window width w, preferably between 1.5 and 8 times the average pixel window width w, more preferably between 1.5 and 5 times the average pixel window width w, even more preferably between 1.5 and 4 times the average pixel window width. The interpixel pitch P may be sufficiently large to prevent significant cross-talk between the different pixels. Between at least two of said plurality of pixels a cooling channel may be provided. The cooling channel may have a depth which is at least 15%, preferably at least 25%, more preferably at least 50% of the penetration depth $L_{abs}$. The detector furthermore may comprise a means for reducing the cross-talk between neighbouring pixels of said plurality of pixels adapted for reducing the cross-talk with a factor of 5, preferably with a factor of 15, more preferably with a factor of 25. The amount of cross-talk thereby is expressed relative to the measured signal in a neighbouring pixel. The means for reducing the cross-talk may be the cooling channel in between pixels, the reflective film on top of non-pixel areas and the means for covering the pixel area for reducing the fill factor. Operation of said detector may be selected between an intensity measuring mode, for measuring the intensity of a light beam, an energy measuring mode, for measuring the energy of a light beam and a power measuring mode, for measuring the power of a light beam by adjusting the penetration depth $L_{abs}$ and the window opening used. The plurality of pixels may be arranged in an array. The plurality of pixels is arranged in a m×n matrix, having m columns and n rows of pixels. At each first electrode a switch and a storage means may be provided, for temporary storing the pixel information. The detector system may furthermore comprise a read-out electronic circuitry adjusted to sample at regular moments the time evolution of the electrical detector outputs and convert the sampled analogue voltages into digital signals. The read-out electronic circuitry may be adjusted for detecting the maxima in time of the detector outputs and convert these sampled analogue voltages into a digital signals. The light penetration depth for the optical spectrum under consideration, dictated by the pulse width and the window opening, may be such that the maximum allowable lattice temperature inside the substrate at the maximum optical power density of the incident laser beam is not reached. The electrical signal measured by the means for measuring an electrical signal may be a voltage, generated between a first contact of a first set of electrodes and a second contact of a second set of electrodes and related to the optically induced temperature profile between the said contacts due to an optical absorption process. Thus, a doped semiconductor substrate with geometrical constraints and having thermoelectric properties is used to convert the beam parameters of high optical power laser beams into electrical signals.

The invention also relates to a system for monitoring the output of a light beam producing means comprising a light beam sampling means and a detector, whereby said light beam sampling means is adjusted to split the light beam in a first small fraction and a second large fraction, whereby said first small fraction of said light beam is directed towards a detector as described above. The beam sampling means may be a mirror, said mirror being rotatably mounted as to split the light beam at regular periods.

The invention furthermore relates to a method for monitoring the profile of a light beam, the method comprising the steps of splitting said light beam into a first fraction for monitoring and a second fraction used for an application, directing said light beam to a detector, measuring with said detector at several points in the cross section of the fraction of the light beam, obtaining a plurality of electronic signals, representing the spatial intensity profile of said light beam. Measuring with said detector at several points in the cross section of the fraction of the light beam may be performed by subsequently shifting a single pixel detector as described above, to another point in the cross-section of the fraction of the light beam and recording a measurement. Measuring with said detector at several points in the cross section of the fraction of the light beam may be performed by measuring simultaneously with a multiple pixel detector as described above, several points in the cross-section of the light beam. For the light beam having a pulse width and the detector being able for measuring in intensity measuring mode, in energy measuring mode or in power measuring mode, the method may comprise setting a pulse width of said light beam for measuring in intensity measuring mode, in energy measuring mode, in energy density mode or in power measuring mode. In the intensity measuring mode, the output of the detection system may correspond with the intensity of the light beam, in energy measuring mode, the output of the detection system may correspond with the energy of the light beam, in energy density measuring mode, the output of the detection system may correspond with the energy density of the light beam and in power measuring mode, the output of the detection system may correspond with the power of the light beam.

The invention furthermore relates to a detector for characterising a high power light beam, said detector comprising at least one pixel, each of said at least one pixel comprising a doped semiconductor substrate adjusted to substantially absorb an incident light beam, being at least a fraction of said high power light beam, over a penetration depth $L_{abs}$, said semiconductor substrate having thermoelectric properties and means for measuring an electrical signal induced by a thermoelectric effect in said doped semiconductor substrate, said means furthermore partly covering the doped semiconductor substrate such that a window opening is provided for receipt of said incident light beam in said doped semiconductor substrate wherein the size of said window opening and said penetration depth $L_{abs}$ are adjusted so that $$\frac{P_{pixel} \cdot L_{abs}}{S_{pixel}}$$

is in the range 0.1 to 100, wherein $P_{pixel}$ is the perimeter of the pixel and $S_{pixel}$ is the surface area of the pixel. The different features described in the dependent claims and in the detectors described above can, where appropriate, be applied to this detector.

The invention furthermore relates to a detector for characterising a high power light beam, said detector comprising at least one pixel, wherein each of said at least one pixel comprising a doped semiconductor substrate adapted to substantially absorb an incident light beam, being at least a fraction of the high power light beam, over a penetration depth $L_{abs}$, said semiconductor substrate having thermoelectric properties and a means for measuring an electrical signal induced by a thermoelectric effect in said doped semiconductor substrate comprising a first electrode at a first side of said doped semiconductor substrate and a reference electrode at a second side of the doped semiconductor substrate, the first and second side being opposite with respect to each other, said means furthermore partly covering the doped semiconductor substrate such that a window opening is provided at the first side of said doped semiconductor substrate for receipt of said incident light beam in said doped semiconductor substrate.

The methods, detectors and detection systems as described above also may be applied for characterising high power radiation beams and are not restricted to high power light beams.

It is an advantage of the present invention that the detection system and method can be used for a wide range of laser systems, reaching from very short pulsed laser systems with pulses in the range of nanoseconds, to continuous wave laser systems.

It is an advantage of specific embodiments of the present invention that the thermal cross talk between pixels can be limited to an acceptable level determined by the user.

It is furthermore an advantage of the present invention that selection can be made of the type of measuring mode of the detection system, by adjusting the pixel configuration and/or the properties of the light beam.

Although there has been constant improvement, change and evolution of devices and methods in this field, the present concepts are believed to represent substantial new and novel improvements, including departures from prior practices, resulting in the provision of more efficient, stable and reliable devices of this nature.

The teachings of the present invention permit the design of improved methods and apparatus for measuring the optical power or energy of high power laser beams, with their temporal evolution and/or their spatial profile.

These and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

BRIEF DESCRIPTION OF THE DRAWINGS

FIG. 4a, FIG. 4b, FIG. 4c and FIG. 4d show a top view and a corresponding cross-sectional view for different lay-outs of the single pixel detector, according to embodiments of the present invention.

Figure 1:
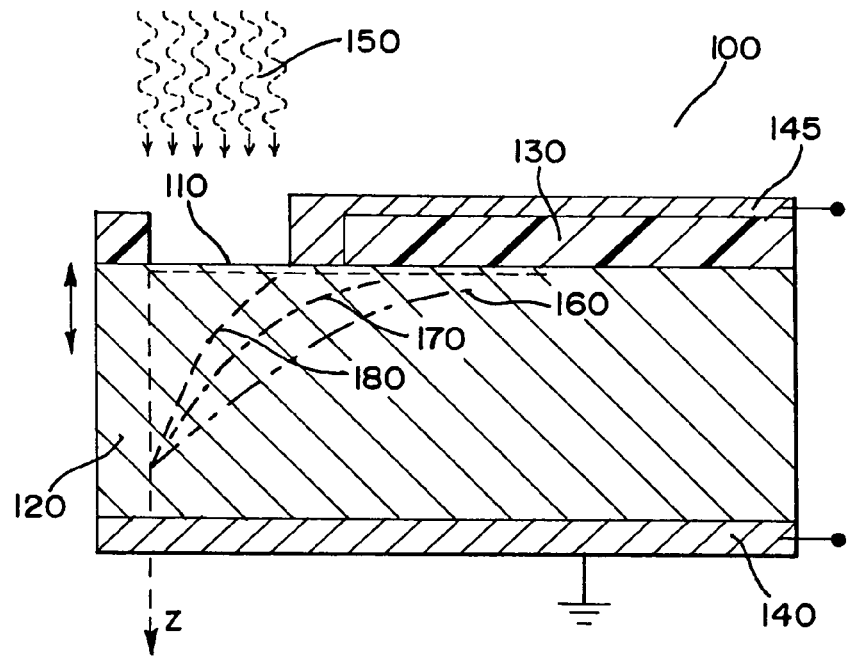
FIG. 1 shows a schematic overview of the detection principle of the invention according to embodiments of the present invention.

In the different figures, the same reference signs refer to the same or analogous elements.

DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. Thus, the scope of the expression "a device comprising means A and B" should not be limited to devices consisting only of components A and B. It means that with respect to the present invention, the only relevant components of the device are A and B.

Similarly, it is to be noticed that the term "coupled", also used in the claims, should not be interpreted as being restricted to direct connections only. Thus, the scope of the expression "a device A coupled to a device B" should not be limited to devices or systems wherein an output of device A is directly connected to an input of device B. It means that there exists a path between an output of A and an input of B which may be a path including other devices or means.

Although the invention has been described for characterisation of high power light beams, the methods and systems also can be applied for characterisation of a large number of other types of radiation.

In a first embodiment, the invention relates to a method of detecting and a detection system for measuring the optical power of a high power incident radiation beam. FIG. 1 illustrates a cross-sectional view of a portion of an opto-electronic device 100 for a first embodiment constructed according to the principles of the present invention. The device 100 comprises a window opening 110 on a doped semiconductor substrate 120 exposed to an incident radiation beam 150 such as a light beam, especially an incident bundled light beam or incident laser beam. The radiation beam may be a pulsed or continuous radiation beam. The incident light may be at any wavelength, e.g. optical, far or near IR or UV wavelengths. Normally, incident light 150 enters the device 100 from air and is exponentially absorbed in the substrate 120. This optical absorption generates heat or a temperature difference in the substrate 120. As the optical beam propagates through the sample, the optical power deeper inside the substrate exponentially decreases due to its local absorption, which leads to decreased local temperature rise deeper inside the substrate. The induced temperature gradient in the electron/hole and/or phonon temperature distribution between a point close to the incident illuminated area and a point sufficiently remote from the incident illuminated area produces a voltage output due to the Seebeck effect.

Voltages generated in the device can be measured using output electrode 140, which can be e.g. at ground potential, and output electrode 145. To prevent short circuiting with the doped semiconductor substrate 120, an insulating layer 130 is provided.

The doped semiconductor substrate 120 may be any semiconductor substrate. Single crystal semiconductor substrates typically have a thermo electromotive force coefficient, also called Seebeck coefficient, in the order of 1 mV/K. The semiconductor substrate 120 in the present invention may be, but is not limited to, e.g. GaAs, InAs, InP, InSb, GaSb. A typical thickness of such a semiconductor substrate 120 may be between 100 and 500 μm.

The conductive electrodes 140 and 145 can be any electrode, such as a metal electrode. Preferably, the electrode is made from a relatively heat resistant material, e.g. the melting point of the electrode material preferably is high. The metal electrodes typically have a thickness of 0.1 to a few microns.

Figure 2:
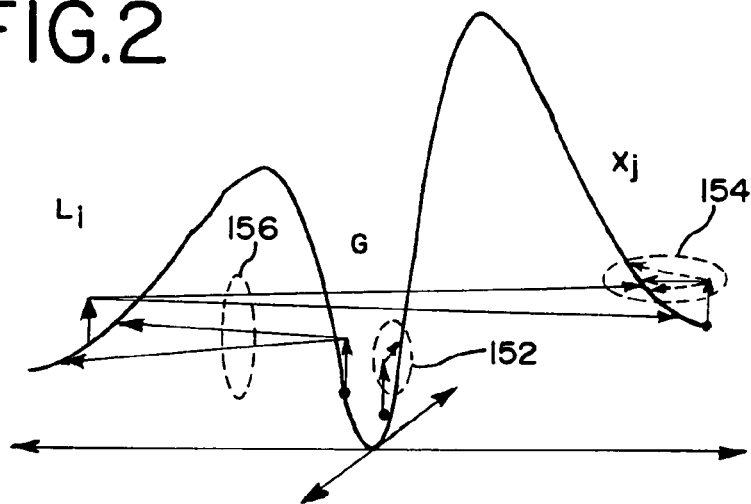
FIG. 2 illustrates some free carrier absorption mechanisms in a multi-valley semiconductor, as used in the embodiments of the present invention.

The incident light 150 can be absorbed in the semiconductor substrate 120 in several ways, i.e. through vibrational excitation or electronic excitation, e.g. free carrier absorption, via chromophores or defects, by band-to-band transitions. In most cases, the most important light absorption mechanism will be based on free carrier absorption. Light absorption by free carrier absorption can take place only by interacting with a third "particle", such as phonons, impurities and other imperfections. Among the various free carrier absorption process one can distinguish between the following main mechanisms: intravalley and equivalent and non-equivalent intervalley absorption mechanisms. The most important intervalley mechanisms at room temperature are (hot) polar optical phonon and impurity assisted absorption. Minor contributions are come from acoustic and nonpolar assisted absorption. Intervalley absorption mechanisms are assisted by intervalley phonons. For a multi-valley semiconductor such as e.g. GaAs, one needs to take into account the following intervalley transfers: the non-equivalent transfers such as Γ-L, L-Γ; Γ-X, X-Γ; L-X, X-L and the equivalent transfers: $L_i$-$L_j$, $X_r$-$X_s$. Some of the intravalley transitions 152, 154 and some of the intervalley transitions 156 are illustrated in FIG. 2. It will be obvious for a person skilled in the art that the detector principle used and thus the detector system of the present invention is not limited by the type of light absorption processes that occurs. The doping level of the semiconductor substrate 120 is preferably adjusted such that the absorption coefficient is optimized for relevant application of the present invention. The selection of the doping level, in accordance with the absorption coefficient to be obtained can be easily performed by a person skilled in the art. Depending of the optical power level and pulse width, a typical range of the absorption length is between 20 and 1000 μm. The smallest absorption lengths are chosen for applications with the lowest optothermal impact and vice versa. For e.g. n-type GaAs and an infrared wavelength of 10.6 μm the corresponding doping concentration is in the range $1 \times 10^{17}$ and $5 \times 10^{18}$ cm$^{-3}$. The largest doping concentration corresponds to the smallest absorption length.

The exponential decay of the optical power along the propagation direction normal to the substrate-air interface is schematically illustrated in FIG. 1 by curve 170. At each co-ordinate z along the propagation direction Z a local electron temperature in case of free electron absorption and phonon temperature is established due the absorption process. It is strongly recommended that only one type of carrier is present, or only electrons or only holes but not together as otherwise the sensitivity of the detector is drastically decreased. In the following we focus on n-type semiconductors having free electrons. The same holds for p-type semiconductors having free holes. Initially only the electron temperature rises. After a short time when there is exchange between the electrons and phonons also the phonon temperature rises. The established 3D temperature profiles inside the substrate are a consequence of drift and diffusion processes of the particles and of the existence of thermal gradients. The free electron temperature and phonon temperature distribution are graphically illustrated by curves 170 and 180, respectively. For times smaller than the phonon temperature rise time, the free electron and phonon temperature differ from each other. After equilibrium has been reached both electron temperature and phonon temperature are equal. For each of the particles, i.e. for the electrons and the phonons, a temperature gradient is induced by the local absorption process. A differential thermo-electromagnetic force voltage is generated due to the gradients in the electron temperature profile a phenomenon called the Seebeck effect. When no electrical current can flow inside the substrate a thermo-voltage is induced by the free electron heating. In the simplest case this can be expressed as follows:

$$\sigma(T_e)\nabla\left(\varphi - \frac{\zeta}{q}\right) = \eta(T_e)\nabla T_e \quad [1]$$

where $\sigma(T_e)$ is the electrical conductivity at temperature $T_e$, $\varphi - \zeta/q$ is called the electrochemical potential, having a pure electrical part $\varphi$ and a pure chemical part $\zeta/q$ with q the electron charge, $\eta(T_e)$ is the thermoelectric coefficient at temperature $T_e$. $\nabla T_e$ is the electron temperature gradient induced by the local absorption process.

The voltage across the sample can then be expressed in the following way:

$$V = \int_{T_{e,1}}^{T_{e,2}} \alpha(T_e) dT_e \quad [2]$$

where $\alpha(T_e) = \eta(T_e)/\sigma(T_e)$ represents the differential thermo-electromotive force (e.m.f.) coefficient or Seebeck coefficient. It is important to notice that this Seebeck coefficient needs to be calculated on the basis of all the conduction band valleys contributing to the heating process. In the case of a p-type semiconductor all the valence band valleys (heavy-hole, light-hole and spin-split off band) need to be taken into account.

As an example, the total value of the coefficient of differential thermo-electromotive force α in the case of multi-valley free electron absorption is given by the following expression:

$$\alpha = (\alpha_\Gamma \sigma_\Gamma + \alpha_L \sigma_L + \alpha_X \sigma_X)/(\sigma_\Gamma + \sigma_L + \sigma_X) \quad [3]$$

where $\sigma_{\Gamma,L,X}$ is the electron conductivity and $\alpha_{\Gamma,L,X}$ is the coefficient of differential thermo electromotive force in Γ, L and X valley, respectively.

In order to solve equation (2), it is necessary to know the electron/hole and phonon temperature distribution. To find the distribution of the phonon temperature $T_L$ in the substrate, the equation of the lattice thermoconductivity is solved $$C \frac{\partial T_L}{\partial t} = \chi \left( \frac{\partial^2 T_L}{\partial x^2} + \frac{\partial^2 T_L}{\partial y^2} + \frac{\partial^2 T_L}{\partial z^2} \right) + P(T_e, T_L) \quad [4]$$

where t is time, x, y, z are the space coordinates, χ is the thermoconductivity coefficient, C is the heat capacity coefficient and $P(T_e, T_L)$ is the power transferred to the lattice by the heated electron gas for electron temperature $T_e$.

Neglecting the effect of the electron/hole thermoconductivity we can write down the following relation:

$$P(T_e, T_L) = \alpha_e W \quad [5]$$

where $\alpha_e$ is the electromagnetic wave absorption coefficient for electrons, and W is the electromagnetic wave intensity inside the substrate. The thermo-voltage generated by the incident laser beam can be sensed between output 140, which is at ground potential, and output 145 respectively. As the substrate 120 is doped and thus may have conducting properties, an insulating layer 130 is provided to prevent a short-circuit between the output connector conductive layer 145, e.g. a metal layer 145 and the substrate 120. The material used for the insulating layer 130 typically may be an undoped semiconductor layer quasi lattice-matched to the substrate (e.g. an AlGaAs layer on a GaAs substrate or an InGaAs layer on an InP substrate) or an $Al_2O_3$ layer, a $Si_3N_4$ layer, . . .

By calculating the output voltage V versus the light intensity W inside the substrate, one can derive the sensitivity $S_{heat}$ expressed in mV·cm²/kW of this detector. A more detailed deduction of the above equations and a more thorough description of the coefficients in these equations can be found in the description of the corresponding quantum-mechanical model for free electron absorption as described by G. Shkerdin, J. Stiens and R. Vounckx e.g. in European Physics Journal, Applied Physics, vol. 19(1), pages 29–38 (2002), in European Physics Journal, Applied Physics, vol. 12(3), pages 169–180 (200), in Journal of Applied Physics, vol. 85(7), pages 3807–3818 (1999), in Journal of Applied Physics, vol. 85(7), pp. 3792–3806 (1999), and as described by E. Driessens, J. Stiens, G. Shkerdin, V. Kotov and R. Vounckx, in proceedings of THERMICS, 9th Workshop on Thermal Investigations of ICs and Systems, pp. 145–148 (Aix-en-Provence, France 24–26 Sep. 2003).

Figure 3:
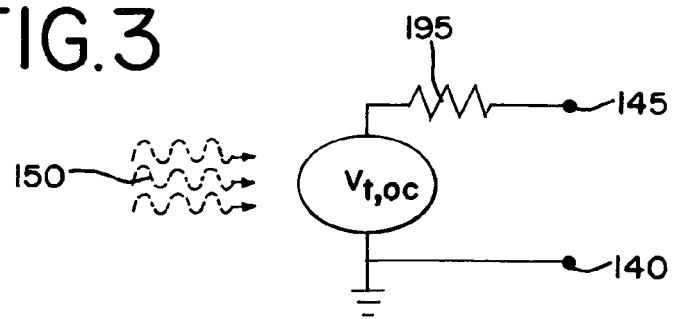
FIG. 3 illustrates the equivalent scheme of a semiconductor based detector, according to an embodiment of the present invention.

A typical sensitivity obtained with the fast electron temperature gradients is about 3.0 mV·cm²/MW, for electron temperature gradients in equilibrium with the phonon temperature gradient this sensitivity is about 1000 times larger, but the detector response time is much slower. The equivalent circuit of the proposed detector is illustrated in FIG. 3 by the open-circuit voltage $V_{t,OC}$ 190, directly connected with the optical power or energy of the incident laser beam 150 depending on the pulse characteristics and the detector geometry. The internal resistance of the circuit is indicated by resistance 195.

The voltage output from any contact reflects the optically induced surface temperature nearby said contact. The temporal evolution of this temperature or corresponding voltage is determined by the substrate 120 and laser pulse characteristics.

The type of detector output, and consequently the information that can be obtained, is determined by the ratio between the laser pulse duration and various time constants of the detector. The following time constants of the detector of this invention are important: the electron heating time, the electron energy relaxation time $\tau_e$ and the lattice thermal response time $\tau_{sub}$.

The heating of the electrons is almost instantaneous with respect to industrial applications. For example in the case of n-type GaAs, this heating time constant is of the order of 100 fs. Hence the electron temperature immediately follows the incoming light intensity. This time constant will not be further considered in this invention.

The electron energy relaxation time $\tau_e$ is not a constant value but depends on material parameters such as the doping concentration and incident light intensity. For e.g. n-type GaAs, this time constant is typically of the order of a few ps. For incident laser pulses which are longer than a few electron energy relaxation time constants, the detector's voltage output will be directly related to the temporal evolution of the laser intensity. In this case the lattice temperature is almost unaffected. When the laser pulse gradually gets longer the energy of the electron gas is gradually transferred to the lattice of the doped semiconductor, such as e.g. the n-type GaAs lattice, which results in a gradually increasing lattice temperature. For a given laser pulse length both electron temperature and lattice temperature get from the same order of magnitude. This is the regime of the mixed electron-lattice effects. The pulse width for which both temperatures gets equal is called the $\tau_{,mix}$ and is in a first order approximation defined by equation [6]:

$$\tau_{mix} = \frac{\tau_e C}{N \cdot k_B} \quad [6]$$

This expression shows that this time constant $\tau_{,mix}$ is dependent on the doping concentration N but not dependent on the light intensity. E.g. for doping concentrations in the range of $10^{18}$ cm$^{-3}$, the pulse width for which both temperatures get equal, i.e. $\tau_{mix}$, is about 100 ns. However, for high optical intensities the expression (6) for $\tau_{mix}$ should be corrected for nonlinear effects and reads then as shown by equation [7]

$$\tau_{mix} = \frac{\delta t_e C}{\alpha_e W} \quad [7]$$

whereby $\delta t_e$ is the increase of electron temperature due to the light absorption process. Numerical simulations show that within the doping concentration interval $0.7 \times 10^{18} - 4 \times 10^{18}$ cm$^{-3}$, the value $\tau_{mix}$ can drop from the range 325–40 ns down to 100–10 ns when the intensity varies from a low level to about 100 MWcm$^{-2}$.

For pulses longer than $\tau_{mix}$ the detector behaves as an energy meter, i.e. the detector's voltage output is the integration of the incident laser intensity. This behaviour will continue as long as the pulse time is smaller than the time constant related to the thermal response time of the illuminated area. Pulse lengths approaching the thermal response time of the illuminated area will be gradually leading to slowing down of the lattice temperature increase due to the thermo-conductivity.

The thermal response time of the illuminated substrate area 110, annotated with $\tau_{sub}$ is described in the following expression [8]

$$\tau_{sub} = \frac{\beta \cdot C}{\chi\left(L_{abs}^{-2} + \min\left(\frac{L_{pix}}{2}, \frac{L_{beam}}{2}\right)^{-2}\right)} \quad [8]$$

wherein C is the heat capacity and $\chi$ is the heat conductivity of the substrate material. $L_{abs}$, $L_{beam}$ and $L_{pix}$, are the absorption length inside the substrate, the laser beam width and the window width of a pixel element, respectively. $\beta$ is a geometrical numerical factor of the order of one and depends on the details of the pulse characteristics and pixel geometry. In contrast to the first two time constants which are only material dependent, the $\tau_{sub}$ is also dependent on the geometry.

For pulses shorter than the thermal response time of the illuminated substrate area 110 but longer than $\tau_{mix}$, the maximum voltage output, and thus the maximum surface temperature $T_{surface,max}$ is proportional to the pulse width $t_{pulse}$ of the laser as given in expression [9] and is independent on the pixel area.

$$T_{surface,max} = K \cdot t_{pulse} W_o / (C L_{abs}) \quad [9]$$

The proportionality factor K thereby lies within the range 0.1 to 10, preferably within the range 0.3 to 7, more preferably between 0.5 and 5, even more preferably between 0.5 and 3. Here $W_o$ is the intensity of the laser beam. One can show that the upper limit for this energy operation regime is approximately given by the time constant $\tau_{erg} = \tau_{sub}/\gamma$. The factor $\gamma$ is determined by numerical calculations and varies roughly between 10 and 100. In order to extend the regime of the energy measurements, i.e. to make $\tau_{erg}$ as large as possible, one needs small $\tau_{sub}$ values in combination with small $\gamma$ values which are reached for large absorption lengths and large pixel sizes.

The temperature can either be sensed in the centre of the pixel or further away from the centre of the pixel at a distance R. Temperatures sensed further away from the centre of the pixel area, e.g. with a perimeter electrode, are directly related to the total energy incident inside the pixel area, hence these temperatures are proportional to pulse width and laser beam area. The factor F(R) is a factor for expressing the dependence on the radius of the perimeter electrode.

$$T_{peri,R} \sim F(R) \cdot t_{pulse} P / (C L_{abs}) \quad [10]$$

Table 1 contains the relative temperature increase for both a centre and a perimeter electrode for laser beams which differ only in size, i.e. have a different radius. The pulses under consideration are 300 ns long incident on a sensor with diameter equal to 400 μm. The relative temperature increase is expressed with respect to the smallest laser beam. This table shows that the relative temperature increase in the centre of the pixel is independent on the beam size whereas the relative temperature increase at the perimeter is almost perfectly related to the ratio of the area.

TABLE 1

| Radius (μm) | Tc, rel | Tp, rel | Area Ratio |
|---|---|---|---|
| 10 | 1 | 1 | 1 |
| 25 | 1.03 | 6.258 | 6.25 |
| 50 | 1.031 | 25.08 | 25 |
| 75 | 1.031 | 56.5 | 56.25 |
| 100 | 1.031 | 105.2 | 100 |

In other words, by properly designing the top electrode used, different types of information can be obtained. For pulse lengths between the timing parameters $\tau_{mix}$ and $\tau_{erg}$, the obtained information for a centre contact of the pixels is the energy incident in the centre of the pixel whereas a perimeter contact, which is far away from the centre of the pixel allows to measure the total energy incident on the pixel. The energy measurement in the centre of the pixel allows, after differentiating of the signal, to obtain information about the time evolution of the intensity in the centre of the pixel. With this type of contact, the output for beams having the same maximum intensity but different beam diameters will always be the same, while the measurement allows to distinguish beams having the same total energy but different maximum intensities. The total energy measurement obtained by use of the perimeter electrode allows to obtain, after differentiation of the signal, information about the time evolution of the average intensity in the pixel. The use of a perimeter electrode allows to distinguish between beams having the same maximum intensity but different total energy. For pulses much longer than the thermal response time $\tau_{sub}$, the maximum output is independent of the pulse width and can be estimated by the following expression $$T_{suface,max} \sim W_0 \min\{L_{beam}, L_{pix}\}^2 / ((L_{abs} + \min\{L_{beam}, L_{pix}\})\chi) \quad [11]$$

This regime, called the regime of power measurements is approximately valid for pulses longer than $\tau_{pow} = \gamma \tau_{sub}$ where $\gamma$ is the same factor as for the energy measurements. In that sense $\gamma$ is defined as follows.

$$\gamma = \sqrt{\frac{\tau_{pow}}{\tau_{erg}}} \quad [12]$$

In order to extend the regime of the power measurements as much as possible, i.e. to make $\tau_{pow}$ as small as possible, one needs the smallest $\tau_{sub}$ values in combination with small $\gamma$ values. The smallest values of $\tau_{pow}$ are reached for small absorption lengths in combination with small pixels. In the power sensing regime the maximum temperature is increasing with increasing pixel sizes. Hence for high optical power measurements it is needed to limit the pixel size which is in favour for a maximum extension of the power regime towards small pulses.

Similar as for beams having a pulse length between $\tau_{mix}$ and $\tau_{erg}$, incident beams having a pulse length larger than $\tau_{pow}$ can be characterised in a different way, depending on the specific top electrode design. Using a centre contact allows to obtain information about the local power incident on the centre of the pixel, whereby differentiating the signal further allows to obtain information about the time evolution of the power in the centre of the pixel. For a perimeter contact, the total power of the incident beam is measured and differentiating allows to obtain information about the time evolution of the total power in the pixel. As a numerical example we take a n-GaAs substrate with a doping concentration $N=7\times 10^{17}$ cm$^{-3}$ and a corresponding absorption length $L_{abs}=294$ μm and with a circular pixel with a radius of 25 μm and a reflective Au layer on top of a secondary insulator layer. One can derive that $\beta=1.9$ and $\gamma=47$. For all laser beams which are substantially larger than the pixel size, formula (8) can be applied to determine the time response of the pixel, i.e. $\tau_{sub}=95$ μs. For laser beams which are shorter than $\tau_{erg}=2$ μs the detector pixel behaves like an energy meter, when the laser beam is longer than 4 ms the voltage output of the pixel is related to the temporal evolution of the optical power of the laser beam. In the latter case, an array of pixels will eventually produce the spatio-temporal evolution of the optical power of the laser beam. In other words, the detection system and method according to the present invention can be operated in 5 different regimes, i.e. three individual regimes and two mixed regimes. The sensor elements can measure in a regime of temporal intensity profiling, a regime of temporal energy measurements, which leads after differentiating to time to temporal intensity profiling, a mixed regime wherein the combination of intensity and energy measurements is made and whereby detailed profiles only can be obtained with numerical models, a regime wherein temporal power measurements can be made and a mixed regime wherein energy and power measurements are combined, whereby detailed profiles can only be retrieved with numerical models. The specific modes like energy measuring mode, power measuring mode and intensity measuring mode can be used either to directly obtain the proper quantity of the light beam that is to be studied, or a combination of these modes can be used to obtain a broad measurement range, i.e. to obtain a system that can provide information about light beams with a very short pulse, i.e. in the range of picoseconds, to continuous wave lighting systems. It thereby is a specific advantage of the present invention that these measurements can be done for optical high power systems, from about 1 Wcm$^{-2}$ up to a few GWcm$^{-2}$. Based on the above equations, a detector system can either be adjusted, i.e. by adjusting for example the pixel configuration, such that a specific measuring mode can be used for a specific type of light beam, or the pulse width of the light beam can be adjusted to be able to measure it in a specific mode for a given detector system.

Persons skilled in the art will understand how to interpret detector and pixel outputs and their temporal behaviour based on the given detector dimensions (substrate material, window opening, absorption length) and a first estimate of the beam characteristics.

Figure 4B:
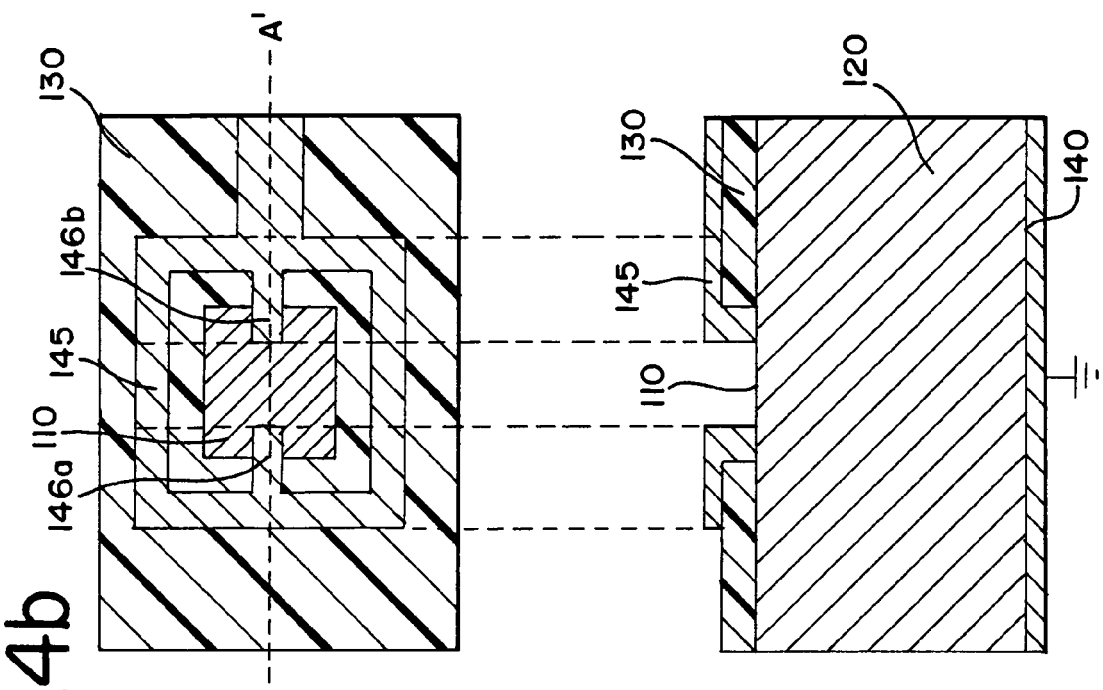
Figure 4A:
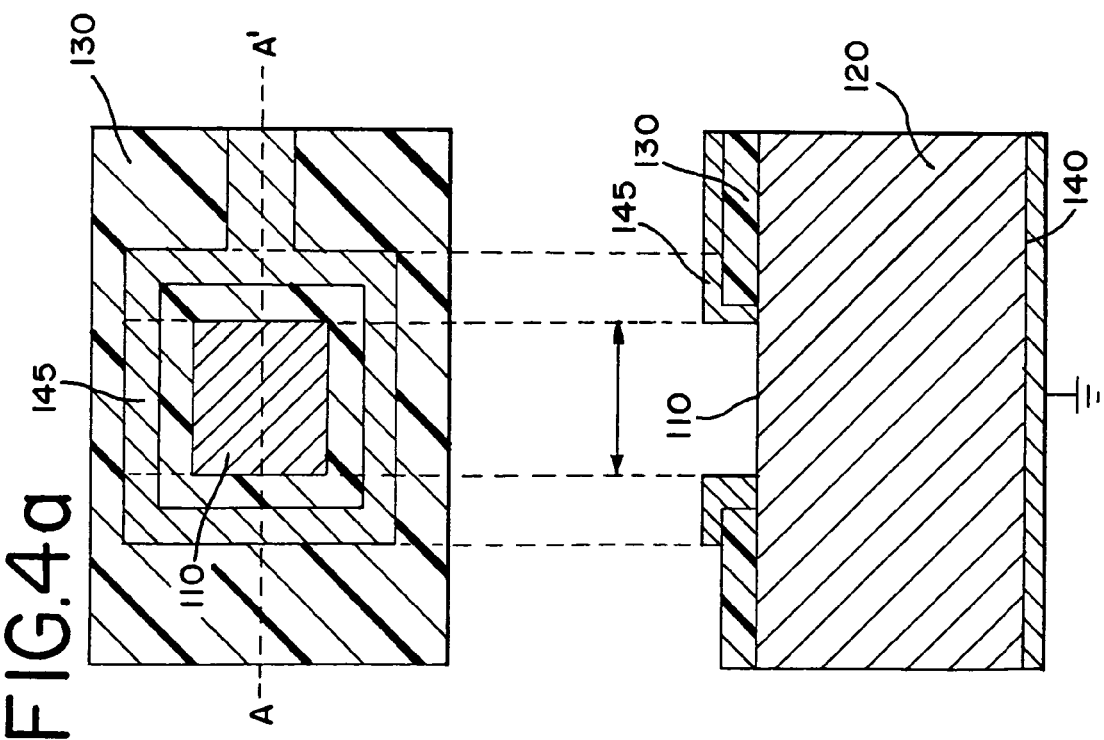

In a second embodiment, several preferred configurations for the sensor elements as described in the first embodiment are described. These preferred configuration are illustrated in FIG. 4a, FIG. 4b, FIG. 4c and FIG. 4d. Ideally the metal contact 145 to the pixel should be minimal in size in order to have minimum disturbance on the optical laser input. However, small contacts 145 can introduce large serial resistances 195. The maximum resistance should not be bigger than the input resistance of the read-out electronics. In case both resistances are equal the sensitivity of the detector is halved. In FIG. 4a the electrical contact 145 to the pixel is provided along the perimeter of the pixel. An insulating layer 130 is partially provided between the metal layer 145 and the doped semiconductor substrate 120. It will be obvious for a person skilled in the art that the shape of the pixel does not need to be a square. It can also be a circular, rectangular or even arbitrarily shaped pixel window. When the laser beam and the pixel are optimally aligned, one can expect that the highest temperature gradient and hence voltage output is established in the centre of the pixel. Hence in a preferred configuration as illustrated in FIG. 4b the metal contacts are in the form of one or more fingers 146a,b, . . . , i.e. an elongated layer having a large length/width ratio, pointing to the centre of the pixel window. The more fingers 146 one provides during manufacturing of the detecting device, the smaller the optical input but the higher the probability that one or more fingers contacts are still intact after the processing. For practical reasons, the number of fingers 146a,b, . . . typically provided during processing of a pixel in a detecting device is about two to three. It is preferred that the insulating layer 130 remains to a large extent under the fingers. In another preferred configuration one or more fingers are connected to an open circular contact rather in the centre of the pixel window. When a maximum optical input power is required, an anti-reflection coating 210 can be provided at the window opening of the pixel as illustrated in FIG. 4c. The anti-reflective coating 210 can be any type of anti-reflective coating, such as a stack of thin films having an alternating refractive index. Typical thin films used therefore are, e.g. coatings of ZnSe, ThF4, YF3, GaAs, Ge. In an alternative design both local electrodes 147, e.g. formed by finger contacts as described above, and a perimeter contact 148, electrically separated from each other are used. The latter is shown in FIG. 4d, showing a top view of a lay-out for a single pixel having a local electrode for example being a centre electrode and a perimeter electrode. The local contacts 147 thereby typically are provided in or near the centre of the sensor. By providing both contacts 147, 148 separated from each other, different types of information can be obtained, by selecting one of these contact 147, 148 or by measuring both an electrical signal between the local electrode 147 and a bottom electrode and an electrical signal between the perimeter electrode 148 and a bottom electrode. Both electrical signals are representative for different types of information about the incident beam, such as described in the first embodiment for different pulse lengths of the incident beams. For pulse lenghts between the timing parameters $\tau_{mix}$ and $\tau_{erg}$, the obtained information for a local contact 147, e.g. a central contact, of the pixels is the energy incident at the local area of the pixel where the contact is made, e.g. in the centre of the pixel whereas a perimeter contact 148 measures the total energy incident on the window 110. For pulse lengths larger than $\tau_{pow}$ using a local electrode 147, such as a centre electrode, allows to obtain information about the local power incident on the local area near the local electrode 147, e.g. the centre of the pixel if a centre electrode is used, whereas for a perimeter contact, the total power of the incident beam on the pixel window is measured. The latter system can be used especially in large single pixel sensors, with a window defining an active or sensitive region of the sensor element that is substantially larger than the beam size. With substantially it is meant that a typical size of the beam, e.g. the beam diameter, is at least 1.5 times, preferably 2 times smaller than a typical size of the window, e.g. the diameter. The perimeter electrode may furthermore also acts as protection layer, thereby defining the active or sensitive area. In this case, the perimeter electrode 148 may be an electrode layer that is insulated from the semiconductor layer 120 except for a small ring defining the window opening. Similar to the previous configurations, insulating layers and anti-reflection coatings may be applied where appropriate. It is to be noted that perimeter contacts yield a smaller sensitivity than e.g. centre contacts. It will be obvious for the person skilled in the art that although circular and square windows are shown in the sensor elements of the present invention, the shape of the window is not limited thereto. This explains why, for beam pulses shorter than $\tau_{mix}$, a local contact at the centre of the pixel allows to obtain information about the beam intensity, while using the perimeter contact, no usable results can be obtained.

In another embodiment of the present invention, the invention relates to a detecting device comprising a plurality of pixels, i.e. e.g. comprising an array of pixels. Linear arrays are particularly suitable for applications where there is relative motion between the detector head and the laser beam. Two dimensional detector arrays are used in a wide range of applications. The exact arrangement of such a detecting device can be adjusted for specific applications, i.e. the pixels may be, but do not have to be arranged in a matrix having n columns and m rows of pixels.

In principle, any of the pixel configurations described in the previous embodiments can be used for a detecting device having multiple pixels, especially the configurations shown in FIG. 4a, FIG. 4b and FIG. 4c. Nevertheless, as soon as more than one pixel is considered, i.e. if the detecting device exists of a one dimensional array (1D) of pixels as will be shown in FIG. 5 or a two dimensional array (2D) as will we shown in FIG. 11, it is important to minimize the cross-talk between the different pixels for a given resolution and to keep an optimum sensitivity. In other words, pixels to be used in a multi-pixel configuration preferably are adapted so that a low inter pixel cross-talk is obtained.

The preferred design rules for lowering the cross-talk to an acceptable level are dependent on the regime of operation of the detector, the different operation regimes being discussed in detail in the first embodiment. In fast laser pulse detection applications cross-talk is of minor importance as heat cannot be transferred fast enough by thermo-conductivity processes. Cross-talk can be neglected in applications where pulse lengths are shorter than $\tau_{mix}$.

For laser pulses longer than $\tau_{mix}$ there is sufficient time to spread heat, the longer the pulse the more heat spreading, hence more cross-talk. In general heat is spread through the substrate from top to bottom, i.e. creating a vertical gradient, and from the centre of the pixel to the sides, i.e. creating a horizontal gradient. To minimize the cross-talk between pixels, given a required pixel pitch, three preferred techniques can be applied. The fill factor of pixels may be lowered, the horizontal gradient may be kept significant smaller than the vertical gradient and/or the heat flux in the horizontal direction may be blocked.

The heat spreading in each direction is proportional to the heat spreading area perpendicular to that gradient. The heat spreading areas are described by the absorption length $L_{abs}$, the perimeter $P_{pix}$ and the surface area $S_{pix}$ of a pixel. The heat spreading area for the horizontal gradients can be defined as $L_{abs} \cdot P_{pix}$ whereas for the vertical gradient the heat spreading area equals $S_{pix}$. Hence minimal cross-talk can be obtained with a minimum ratio $P_{pix} \cdot L_{abs}/S_{pix}$. In the case of the circular pixel with radius $R_{pix}$ this ratio becomes $2L_{abs}/R_{pixel}$.

This simple expression shows that cross-talk can be lowered with smaller absorption lengths. A smaller absorption length, however, results in a more localized energy deposition, hence in higher temperature rises. In the case of a very high absorption length, corresponding to extreme high doping concentrations, the local temperature rise will be unacceptable and will lead to thermal damage. In comparison with quantum well detectors, pyroelectric and bolometer membrane detectors, moderate doping concentrations, i.e. in the range $0.4 \cdot 10^{18}$–$4 \cdot 10^{18}$ cm$^{-3}$, in n-GaAs lead to absorption lengths which are at least more than one order of magnitude larger. Depending of the optical power level and pulse width, a typical range of the absorption length in this invention is between 20 and 1000 µm, whereas in the prior art this is of the order of micrometer of even submicron. This explains why the detector mechanisms of this invention are preferred over other detectors in large optical power applications. Inter pixel cross-talk in high optical power applications can be preferentially further reduced by using smaller fill factors, i.e. by partially diverting e.g. reflecting these portions of the light beam which are not close to a pixel centre. Although this does decrease the vertical heat spreading area which is not beneficial for cross-talk reduction, the overall effect is positive. Smaller exposed pixel areas allow more space between the pixels for a given pixel pitch, which indeed is a big advantage for the cross-talk reduction. Having smaller fill factors also leads to a smaller thermal impact of the laser beam on the substrate. Reduction of the filling factor is shown for a line detector and corresponding pixel configurations in FIG. 5 to FIG. 8.

Figure 5:
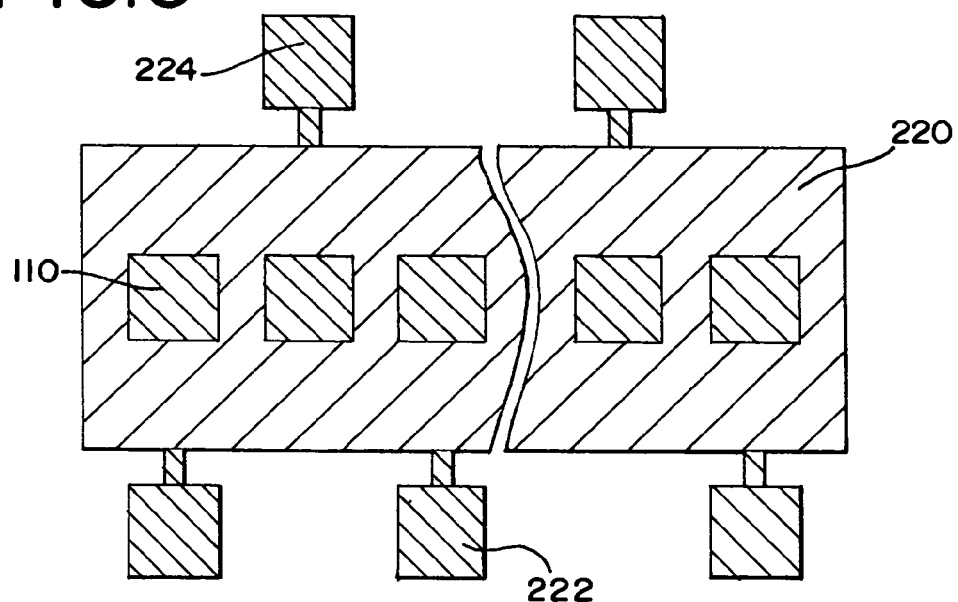
FIG. 5 is a schematic overview of a one dimensional array of detector pixels, each of them provided with a pad for external connection, according to an embodiment of the present invention.

FIG. 5 is an illustration of a single array detector, i.e. a line of pixels in a multi-pixel configuration. The detection system shown, comprises on top of the layers of the previously described embodiments a reflective/protective layer 220. The detection system furthermore shows sensor element window openings 110 determining the active region of the detector. The reflective/protective layer 220 may be any type of layer having a high reflection coefficient, like e.g. a metal layer. The reflective/protective layer 220 can be e.g. made of Al, Ni, Cr, Ag, Cu or Au. Each of the detector pixels is provided with a pad for external connection 222, 224. In a preferred embodiment, the external connections can be alternatingly positioned on the one side and on the other side of the line detector, thereby improving the ease of contacting.

Figure 6:
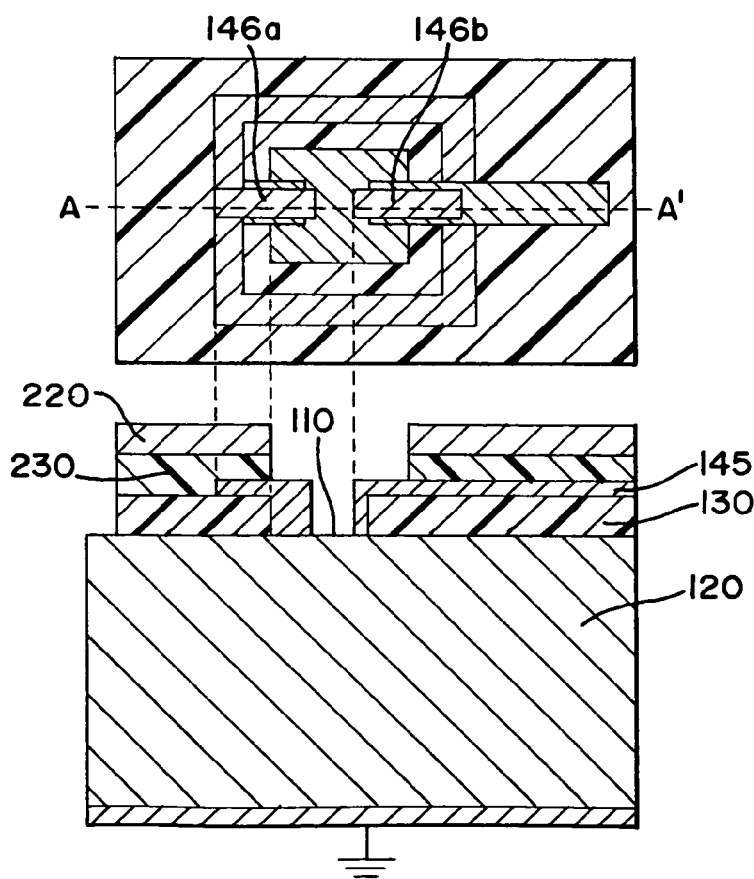
FIG. 6 shows a top view and a corresponding cross-sectional view for different lay-outs of a single pixel detector with a protective/reflecting top metal layer, according to an embodiment of the present invention.

A first pixel structure for a single pixel in a multi-pixel configuration, as shown in FIG. 5, is shown in top view and corresponding cross-sectional view along line A–A' in FIG. 6. On top of the layers of the previously described embodiments a reflective/protective layer 220, separated from the rest of the structure by an electrically and thermally insulating layer 230, is provided.

Figure 7A:
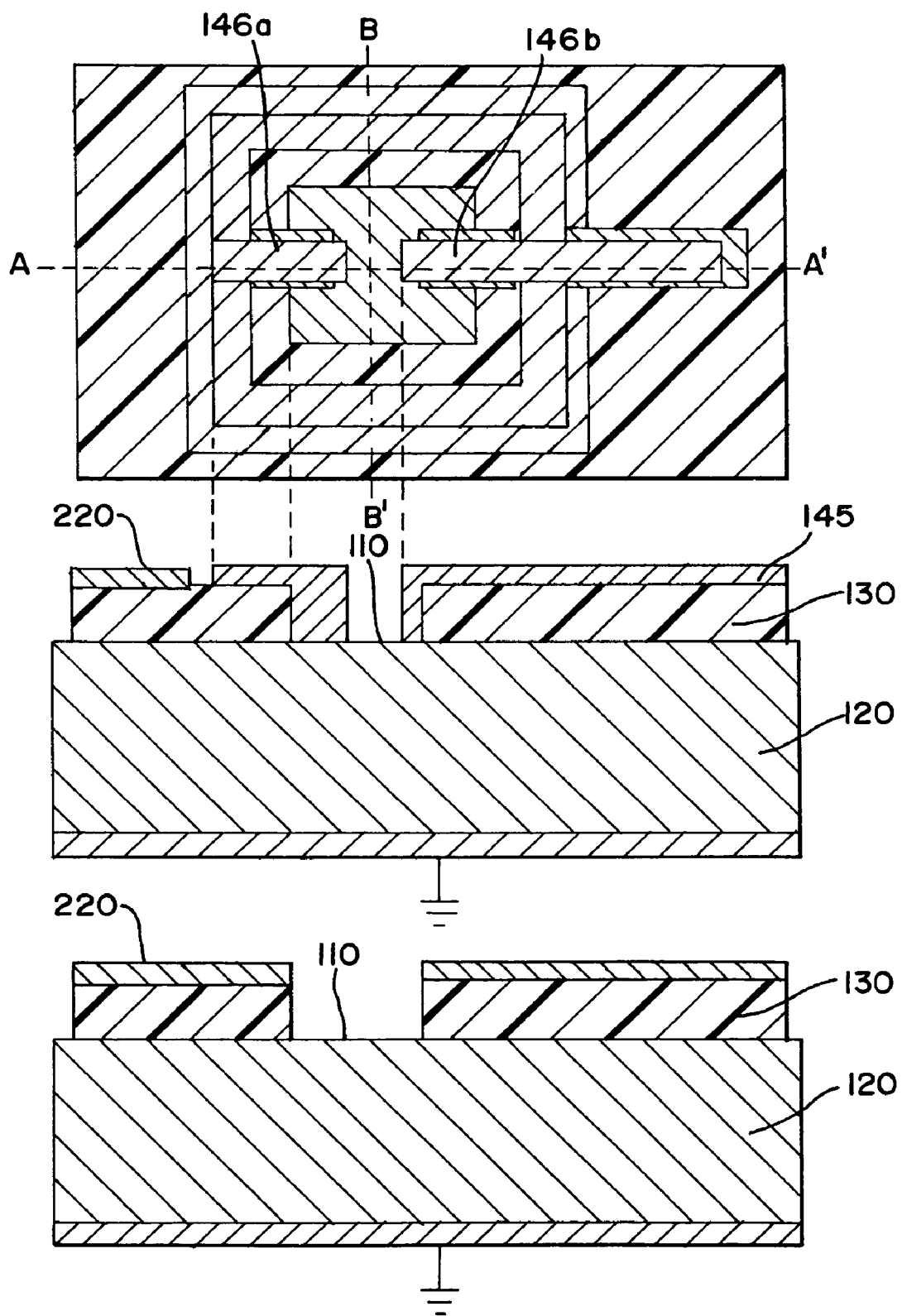
FIG. 7a shows a top view and corresponding cross-sectional views for a detector lay-out with a reflective/protective layer complementary to the metallization pads, according to an embodiment of the present invention.
Figure 7B:
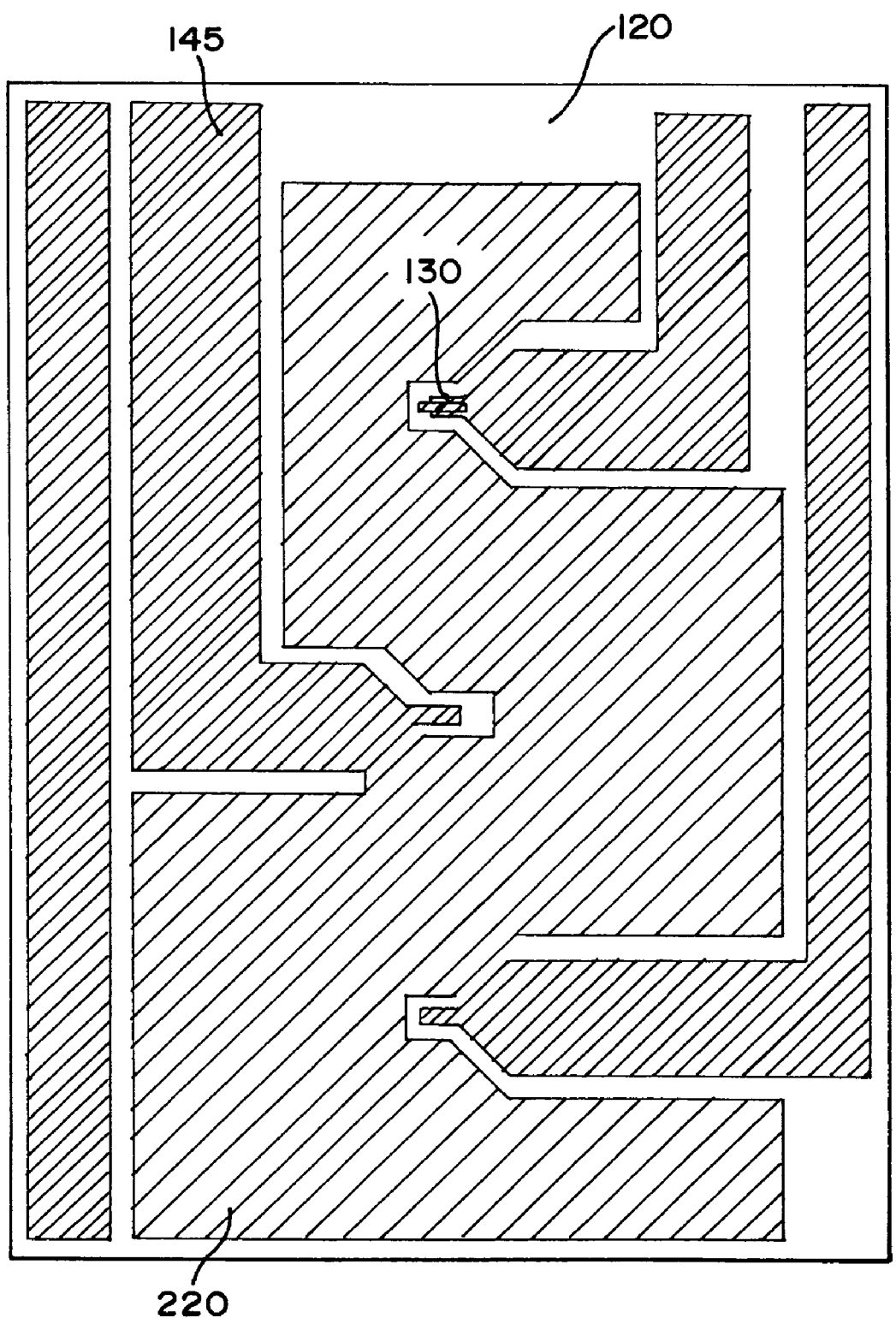
FIG. 7b shows a top view of an alternative design for a detector lay-out with a reflective/protective layer complementary to the metallisation pads, according to an embodiment of the present invention.
Figure 8:
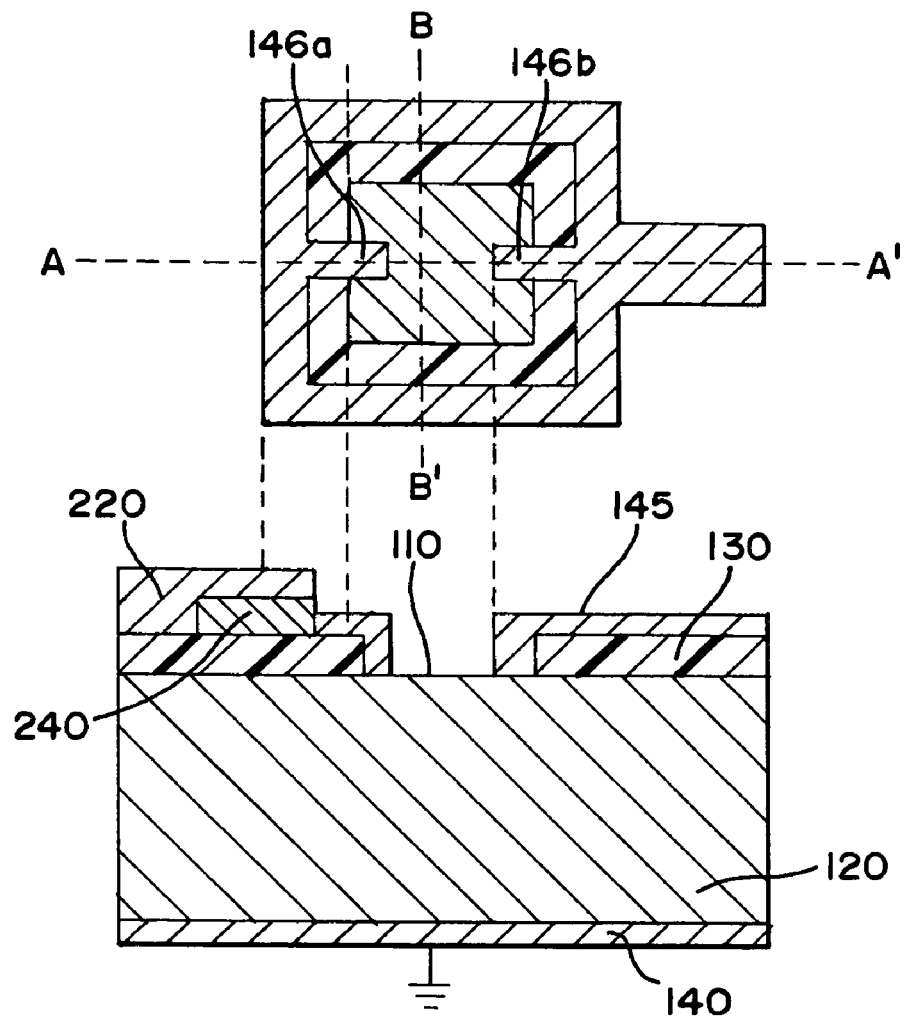
FIG. 8 shows a top view and corresponding cross-sectional views for a detector lay-out with a reflective/protective layer complementary to the metallisation pads and isolated from each other, according to an embodiment of the present invention.
Figure 8:
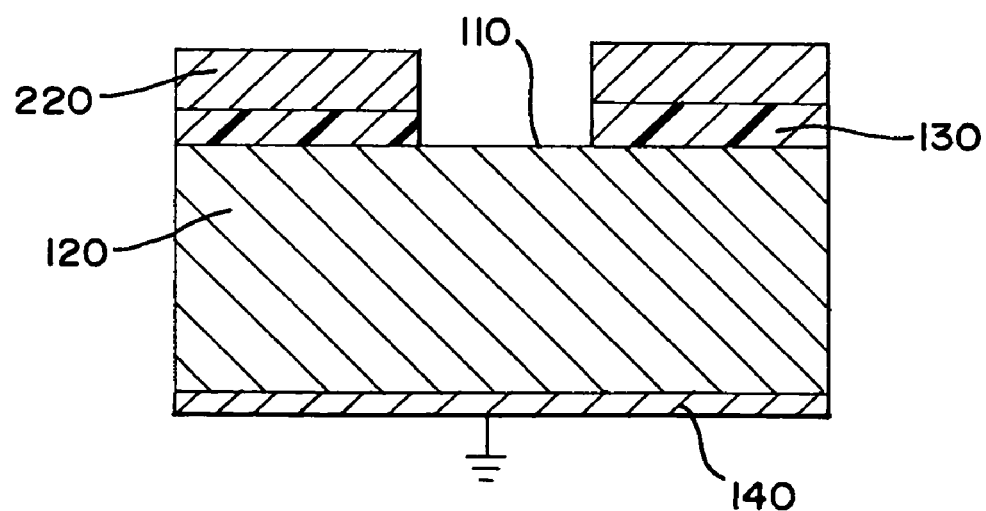

A second configuration for a single pixel in a multiple pixel device having a reduced thermal cross-talk between different pixels is shown in FIG. 7a both in top view and in two corresponding cross-sectional views along lines A–A' and B–B'. The pixel has a similar design as the pixel design of the previous configuration, but in contrast to this configuration shown in FIG. 6, the reflective/protective layer 220 is not provided on top of a second insulating layer 230, but is deposited on the first insulating layer 130 such as the contacting layer 145, but complementary thereto. This complementarity is shown in more detail in an alternative design for a detector lay-out with a reflective/protective layer complementary to the metallization paths in FIG. 7b.

The complementarity between the relfective/protective layer 220 and the contacting layer 145 can also be implemented by using an additional insulating layer 240 separating and insulating the reflective/protective layer 220 from the contact metal 145. The latter is shown in top view and for two corresponding cross-sectional views along lines A–A' and B–B' in FIG. 8.

Figure 9:
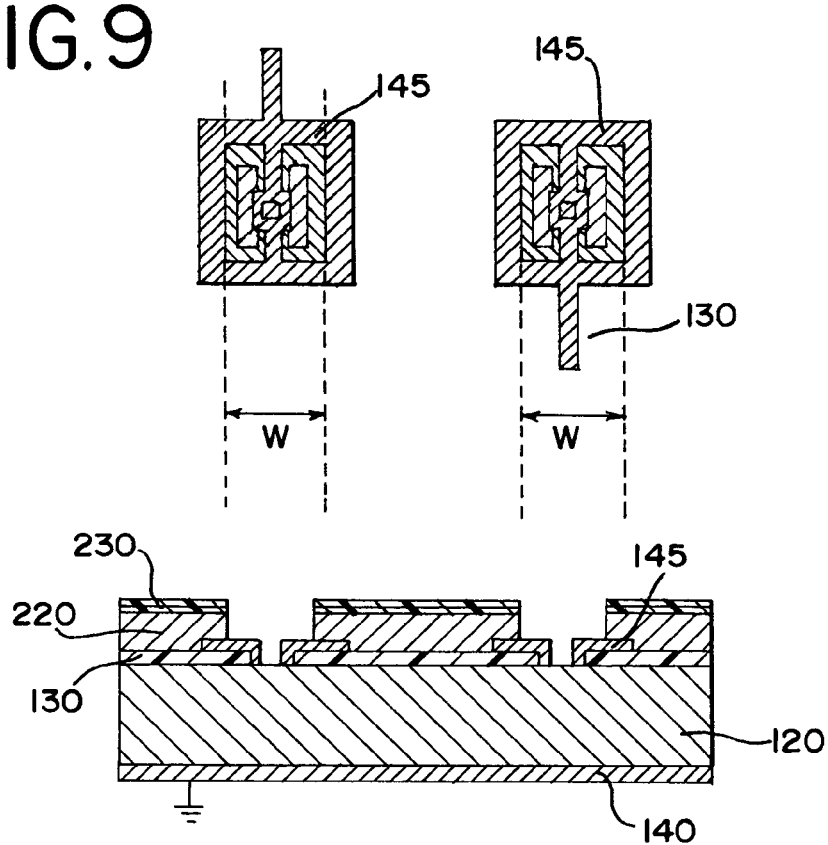
FIG. 9 shows a top view and a corresponding cross-sectional view for two pixels from a one dimensional line array for the energy sensing regime, according to an embodiment of the present invention.

As a rule of thumb in the energy sensing regime, the interpixel distance P, also referred to as interpixel pitch, should be minimal 1.5 to 2 times larger than the window opening w. An illustration of a detector with sensor elements having a significant large interpixel pitch P is illustrated by way of example in FIG. 9.

In the power sensing regime, heat spreading between the pixels is maximum due to the long exposure of the pixels to the laser beam. Reduction of cross-talk therefore is even more important for this operation regime. It is therefore preferred to obtain as much reduction as possible. Therefore, especially for detector elements in the power sensing regime, a combination of techniques is used, combining the implementation of small fill factors with blocking of the thermal heat flux in the horizontal direction.

Figure 10:
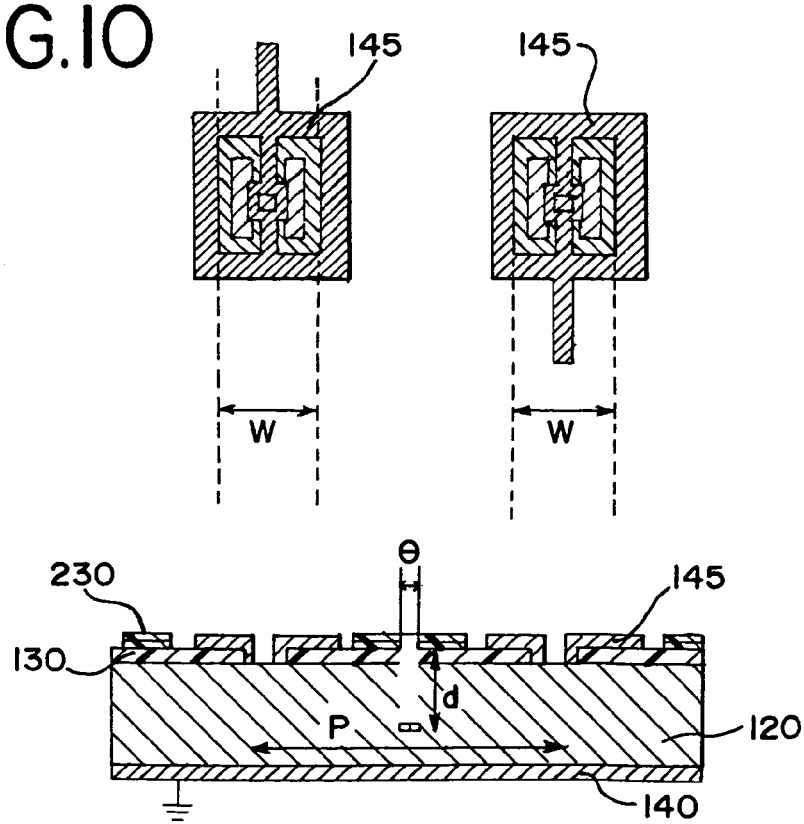
FIG. 10 shows a top view and a corresponding cross-sectional view for two pixels from a one dimensional line array for the power sensing regime, according to an embodiment of the present invention.

An illustration of a system, allowing to block the thermal heat flux in the horizontal direction is shown in FIG. 10. If a small fill factor is used, there is sufficient space between the exposed areas to etch air channels 275 with width e and depth d. These air channels 275 will act as good thermal insulator between the pixels. This is very effective as soon as the etch depth d is at least a substantial fraction, i.e. at least 10% preferably 20% more preferably 50% or is at least equal to the absorption length. Typically the width of these vias is less important. A typical width may be in the range 5 to 50 μm wide. Simulations show that the cross-talk can be reduced with a factor 5 to 25 such that the aboulte cross-talk is below a 5% acceptance level of the laser application.

Persons skilled in the art will understand how to interpret detector and pixel outputs and their time dependent cross-talk influences based on the given detector dimensions such as substrate material, window opening, absorption length and derive a first estimate of the beam characteristics.

Figure 11A:
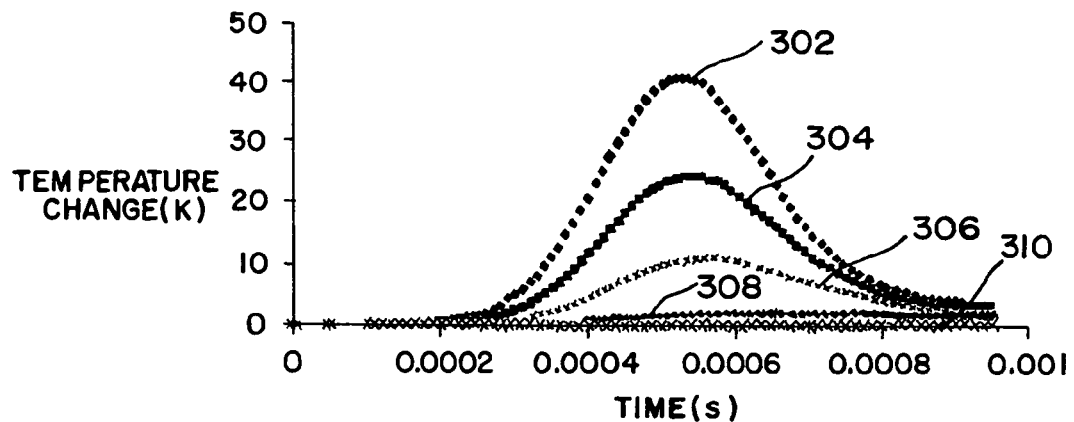
FIG. 11a is an illustration of the time evolution of the temperature at various depths inside a substrate at the centre position of a detector pixel, according to an embodiment of the present invention.
Figure 11B:
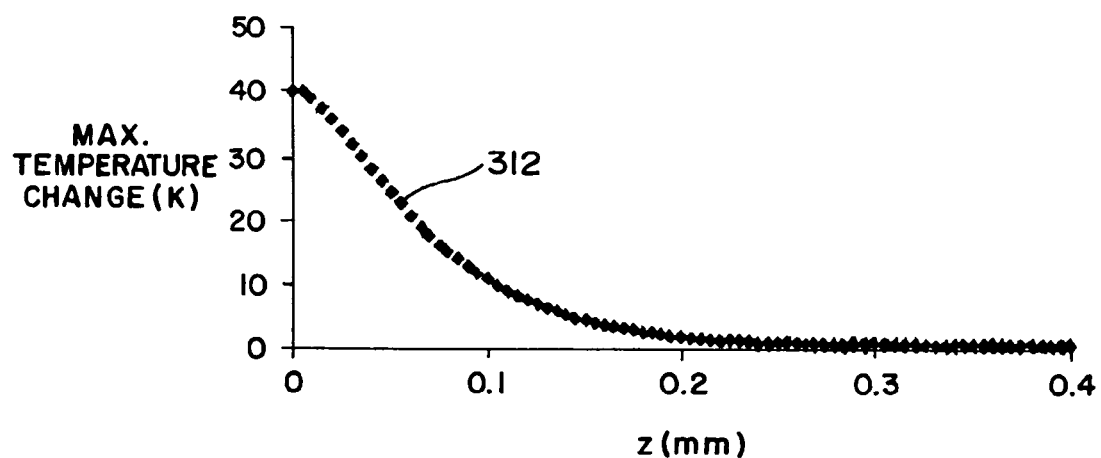
FIG. 11b is an illustration of the corresponding maximum outputs at various depths inside the substrate, for a detector pixel according to an embodiment of the present invention.

By way of illustration, exemplary results for temperature distribution and thermal cross talk are shown in FIG. 11a to FIG. 13b for sensor elements according to the present invention. FIG. 11a and FIG. 11b, illustrate exemplary graphs of the temperature distribution in the depth of the substrate for a 1 mm wide incident laser beam with a peak intensity of 25.6 kW/cm² and a pulse width of 300 μs on an n-type GaAs detector substrate with a doping concentration $N=2.5 \times 10^{18}$ cm$^{-3}$ and a corresponding absorption length of 46.7 μm and having a circular pixel with a radius of 25 μm and a reflective Au layer on top of a secondary insulator layer. The different curves in FIG. 11a show the temperature evolution at the centre of the detector pixel at various depths inside the substrate, i.e. the temporal behaviour of the temperature distribution. The response, i.e. temperature evolution, is shown for a depth z=0 μm by curve 302, for z=50 μm by curve 304, for z=100 μm by curve 306, for z=200 μm by curve 308 and for z=400 μm by curve 310. The graph of FIG. 11b shows the curve 312 indicating the corresponding maximum temperatures at various depths. These exemplary graphs show which distance needs to be respected in the depth to place the ground contact such that a maximum output is detected. The ground contact thus needs to be place outside the integrated in time absorption volume to obtain a maximum output. For the present example, a depth of at least 0.2 mm needs to be respected.

Figure 12A:
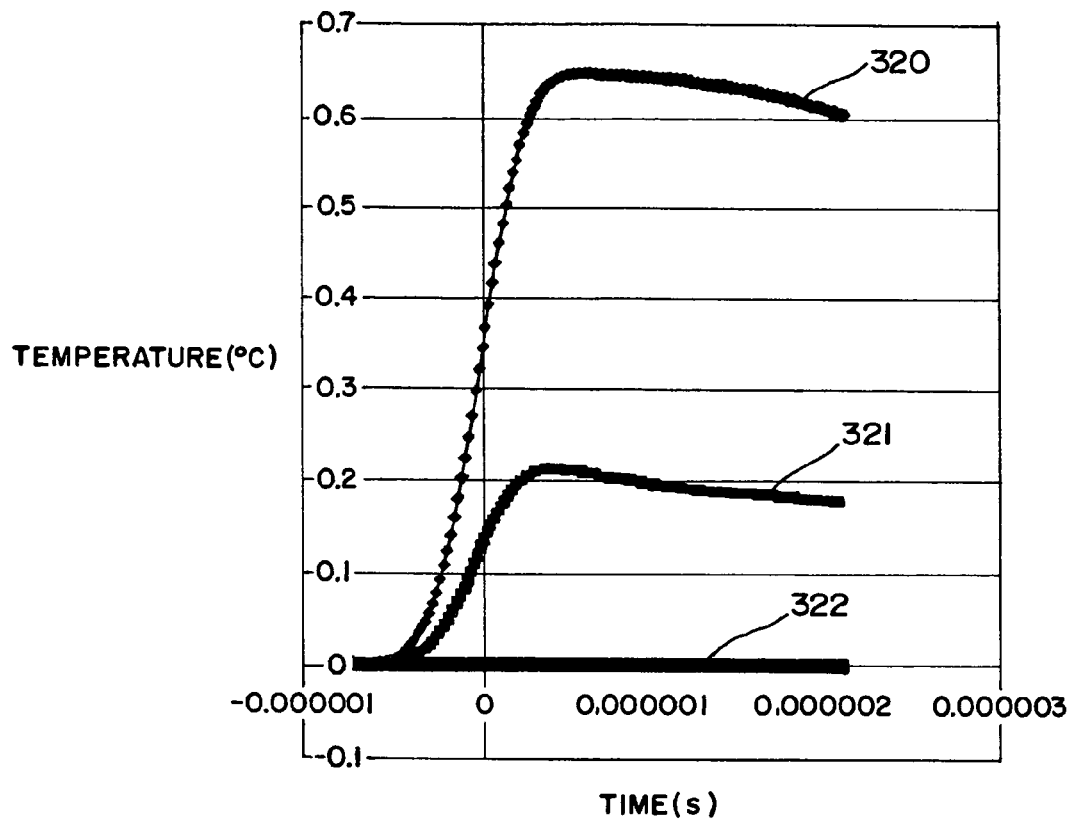
FIG. 12a, FIG. 12b and FIG. 12c shows the time evolution of the temperature at various distances from the centre of the pixel on the top side of the substrate for the energy sensing regime (FIG. 12a), the mixed energy-power regime (FIG. 12b) and the power sensing regime (FIG. 12c) according to embodiments of the present invention.
Figure 12B:
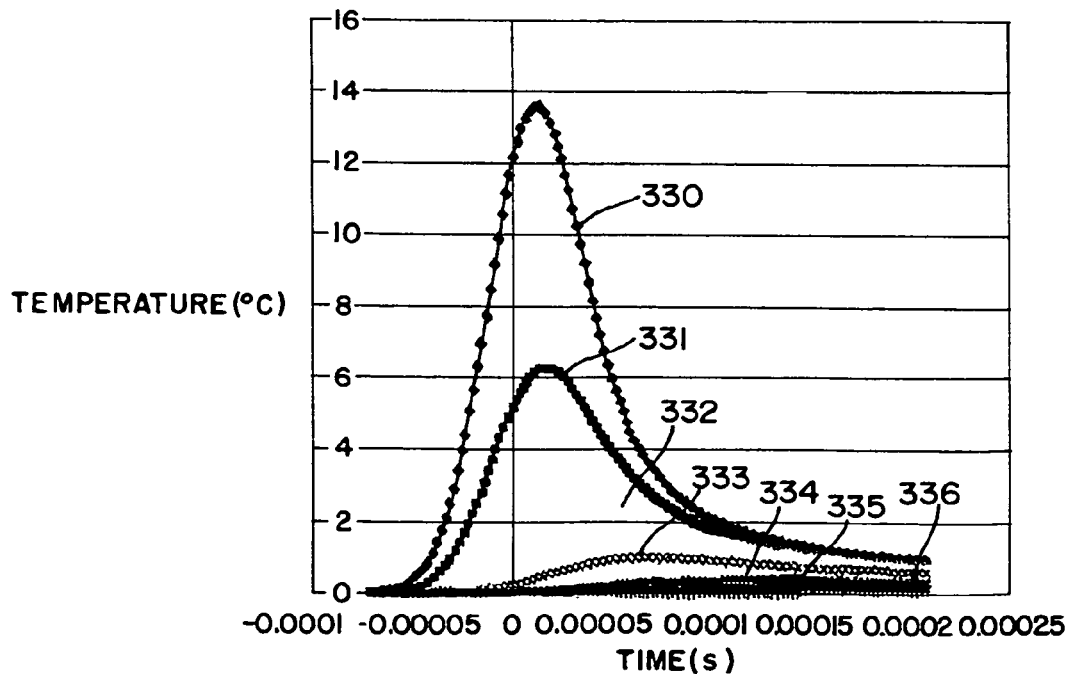
Figure 12C:
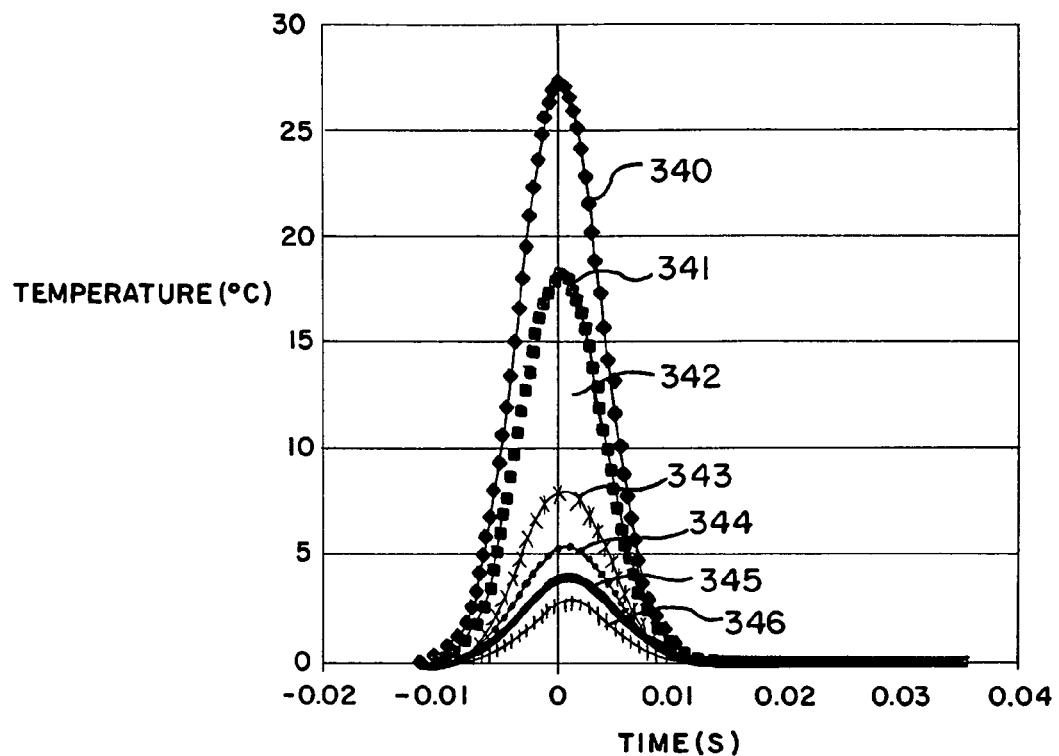

FIG. 12a, FIG. 12b and FIG. 12c illustrate exemplary graphs of the temporal evolution of the temperature distribution on the top side of the substrate for a 1 mm wide incident laser beam with a peak intensity of 25.6 kW/cm² and various pulse widths, i.e. 300 ns, 30 μs and 5 ms on an n-type GaAs detector substrate with an absorption length of 100 μm and having a circular pixel with a radius of 25 μm and a reflective Au layer on top of a secondary insulator layer. The curves on the various graphs correspond to different distances from the pixel centre, expressed in multiples of the pixel radius, i.e. 0×, 1×, 2×, 4×, 6×, 8×, and 10× the pixel radius. In the energy sensing regime, illustrated in FIG. 12a using a laser beam with a pulse width of 300 ns, the detector's output is the integration of optical input. Only in the centre of the pixel, indicated by curve 320, and at the pixel radius, indicated by curve 321, the temperatures is changing. For the curve 322 indicating the temperature in a point 2 times the pixel distance away from the pixel centre, and the other curves (not referred to) indicating points even further away from the pixel centre, the temperature is almost constant. Once the pulse is finished, the temperatures gradually decrease due to thermal leakage of the pixels. In the mixed energy-power sensing regime, illustrated by FIG. 12b 12a using a laser beam with a pulse width of 30 μs, a much bigger temperature change at various distances from the pixels can be seen. FIG. 12b shows the results for the centre of the pixel, indicated by curve 330, and for points 1×, 2×, 4×, 6×, 8× and 10× the pixel radius away from the centre of the pixel, indicated respectively by curves 331, 332, 333, 334, 335, 336. This temperature change is not any longer proportional to the incoming energy due thermo-conductive effects of the substrate lattice. The mixed energy-power regime is characterised by the fact that at different distances from the pixel the temperature reaches its maximum at another moment in time. In this regime a numerical models needs to be applied to derive the spatio-temporal information about the laser beam. FIG. 12c illustrates the temperature change for the power sensing regime using a laser beam with a pulse width of 5 ms. In this regime the maximum temperature is simultaneously reached at various distances from the centre of the pixel. The temperature information in the centre of pixel yields direct the temporal evolution of the power incident on the pixel. The temperature change is shown for the pixel centre, indicated by curve 340, and for points 1×, 2×, 4×, 6×, 8× and 10× the pixel radius away from the centre of the pixel, indicated respectively by curves 341, 342, 343, 344, 345, 346.

Figure 13A:
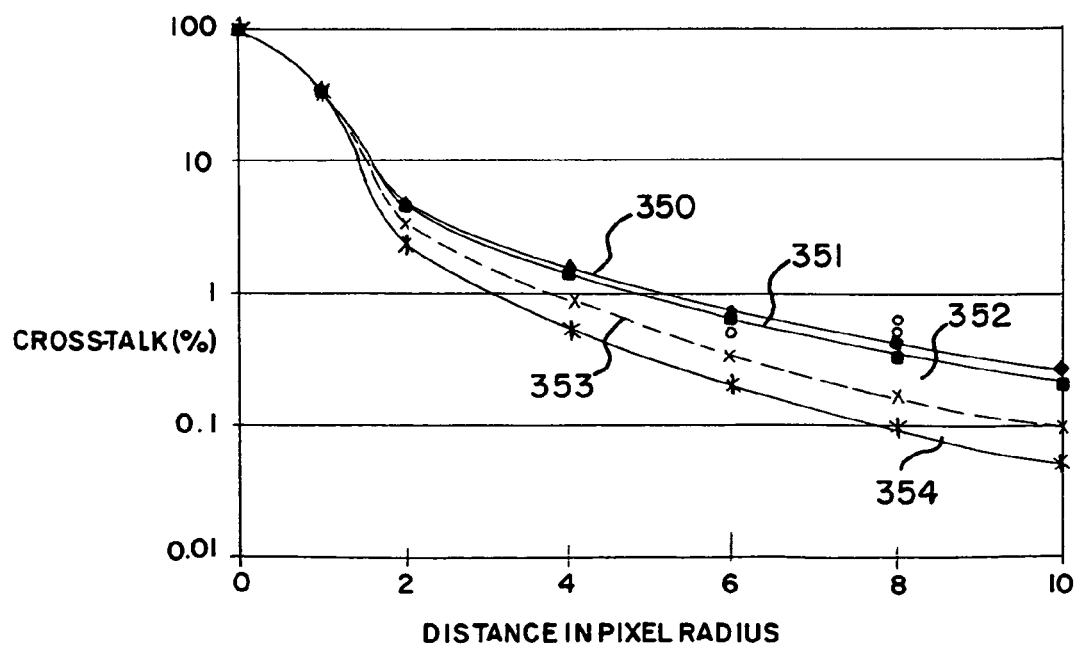
FIG. 13a and FIG. 13b shows an illustration of the cross-talk versus the distance from the centre of the pixel for various doping concentrations with and without etched air gaps, for the energy sensing regime (FIG. 13a) and the power sensing regime (FIG. 13b) according to embodiments of the present invention.
Figure 13B:
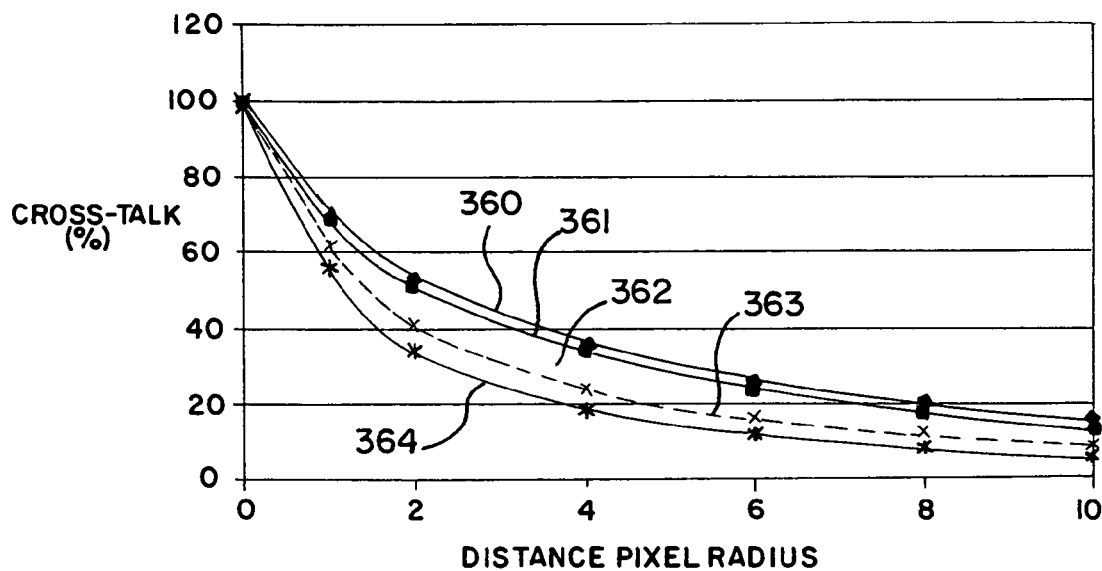
Figure 13C:
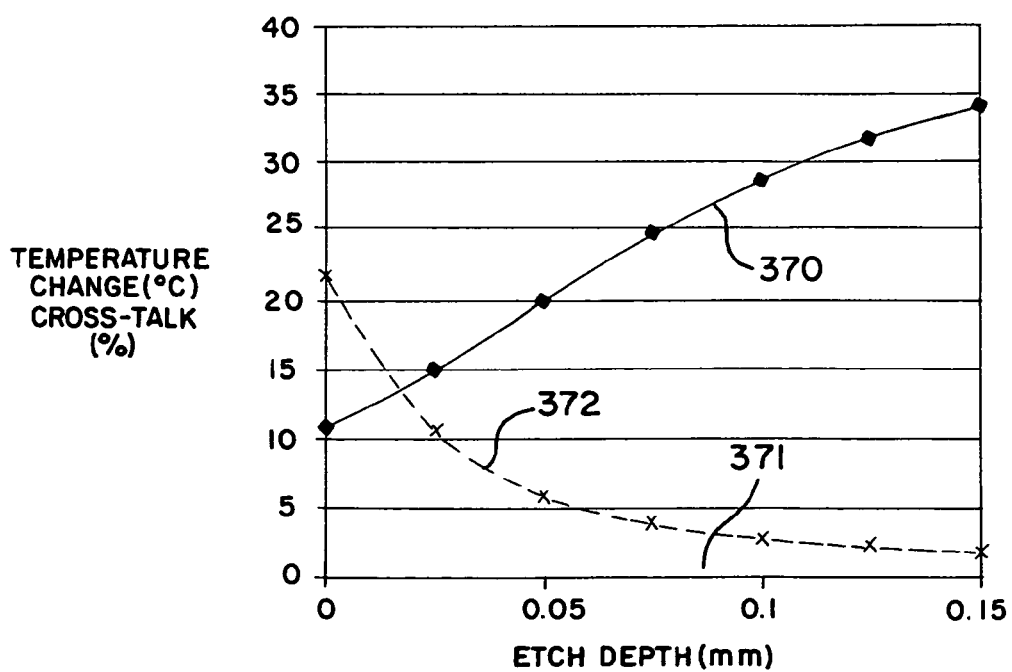
FIG. 13c shows an illustration of the cross-talk reduction versus the depth of the etch air gap according to embodiments of the present invention.

Examples of cross-talk calculations where the blocking of the horizontal thermal heat flux is not implemented are shown in FIG. 13a and FIG. 13b for the energy sensing and power sensing regime, respectively. Both figures give an overview of the cross-talk at the moment when the temperature is maximum in the centre of the pixel for different absorption coefficients expressed in mm$^{-1}$. The sensor structure and laser beam used in the example of FIG. 13a is identical to the sensor structure and laser beam used in the example of FIG. 12a. FIG. 13a shows that in the energy sensing regime the cross-talk between pixels is between 5% and 1% (5%–1%) when the pixel centres are 3 pixel radii away from each other. This means that for an illuminated first pixel leading to an output signal S, a neighbouring pixel, not illuminated directly, may indicate a signal of maximally 5% of the signal S measured in the first pixel. Obviously, if the pixel centres are separated by a larger distance, the cross-talk is smaller. The amount of cross-talk is indicated for $\alpha=34$ mm$^{-1}$, $\alpha=55$ mm$^{-1}$, $\alpha=96$ mm$^{-1}$, $\alpha=215$ mm$^{-1}$, $\alpha=474$ mm$^{-1}$ by curves 350, 351, 352, 353, 354 respectively. The largest cross-talk values correspond with the smallest doping concentration, whereas the smallest cross-talk values correspond with the largest doping concentration. The laser beam and sensor structures used for illustrating cross-talk in the power sensing regime as shown in FIG. 13b, is the same as that of FIG. 12c. The curves are parametrized in values of the absorption coefficient. The curves for the power sensing regime show that the cross talk without air gap is unacceptably high even at large distances: more than 10% at 6 to 8 pixel radius away. The amount of cross-talk is indicated for different absorption lengths, i.e. for $\alpha=34$ mm$^{-1}$, $\alpha=55$ mm$^{-1}$, $\alpha=96$ mm$^{-1}$, $\alpha=215$ mm$^{-1}$, $\alpha=474$ mm$^{-1}$ by curves 360, 361, 362, 363, 364 respectively. FIG. 13c shows an example of how this cross-talk can be substantially reduced by etching a thermally insulating air gap in the case of a 50 µm wide incident laser beam with a peak intensity of 25.6 kW/cm$^2$ and a pulse width of 300 µs on an n-type GaAs detector substrate with a doping concentration N=7.7×10$^{17}$ cm$^{-3}$ and a corresponding absorption length of 294 µm and having a circular pixel with a radius of 25 µm. Curve 370 shows the temperature change as measured in the centre of the light beam, while curve 371 shows the temperature change as measured in a neighbouring pixel outside the light beam, separated from the pixel by an air gap of 50 µm wide. The cross-talk is indicated by curve 372, indicating that the cross-talk can be decreased below a 5% acceptance level when the etch depth is 50 µm, which is about 20% of the absorption length in this illustrative example. Table 2 shows with numerical examples how the cross-talk reduction factor depends on the ratio between the absorption length and the depth of the thermal insulating gap. In both cases a 150 µm deep gap is compared with a flat structure. Reduction factors between 15 and 25 can be reached when the gap depth-absorption length ratio is varied between 16% and 300%. The cross-talk reduction is most effective for the smallest absorption lengths, but actually does not depend much on it. On top of that the sensitivity of the pixel has increased by about a factor of three.

TABLE 2

|  | d (µm) | ΔTc (K) | ΔTout (K) | X-talk (%) | Reduction |
|---|---|---|---|---|---|
| $\alpha = 34$ cm$^{-1}$ | 0 | 11.46 | 3.61 | 31.50 |  |
|  | 150 | 40.34 | 0.79 | 1.96 | 16.09 |
| $\alpha = 215$ cm$^{-1}$ | 0 | 43.27 | 10.26 | 23.71 |  |
|  | 150 | 123.57 | 1.27 | 1.03 | 23.07 |

It will be obvious that the results shown above by way of illustration, which are based on the above mentioned equations and the corresponding model, are only exemplary for the given pixel structure and that similar results can be obtained for any incident laser beam on any suitable pixel structure on a preferred substrate of a detecting device according to the present invention.

Figure 14A:
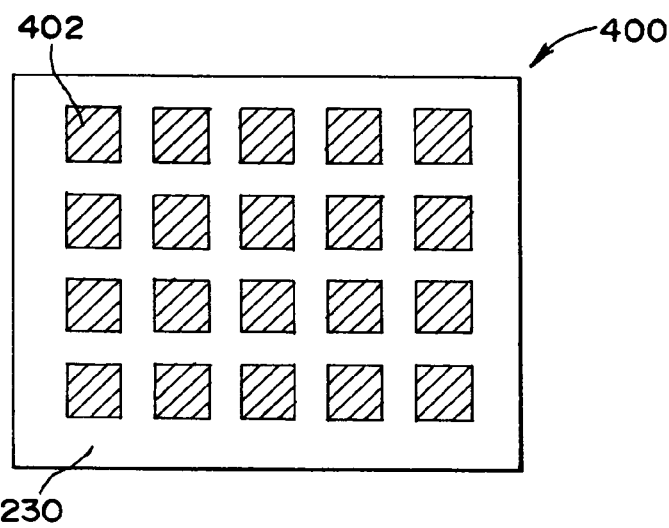
FIG. 14a and FIG. 14b shows a schematic illustration of a two dimensional array of detector pixels (FIG. 14a) and an equivalent scheme of the pixel electronics (FIG. 14b) for a detector system according to an embodiment of the present invention.
Figure 14B:
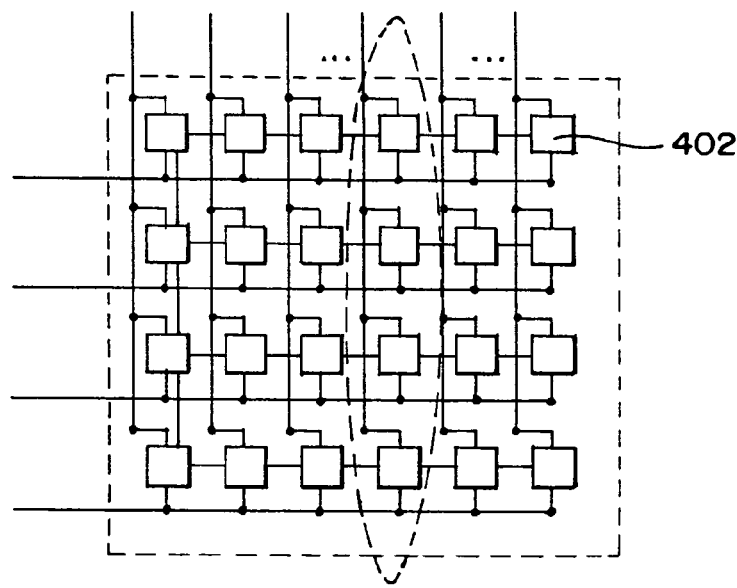
Figure 14B:
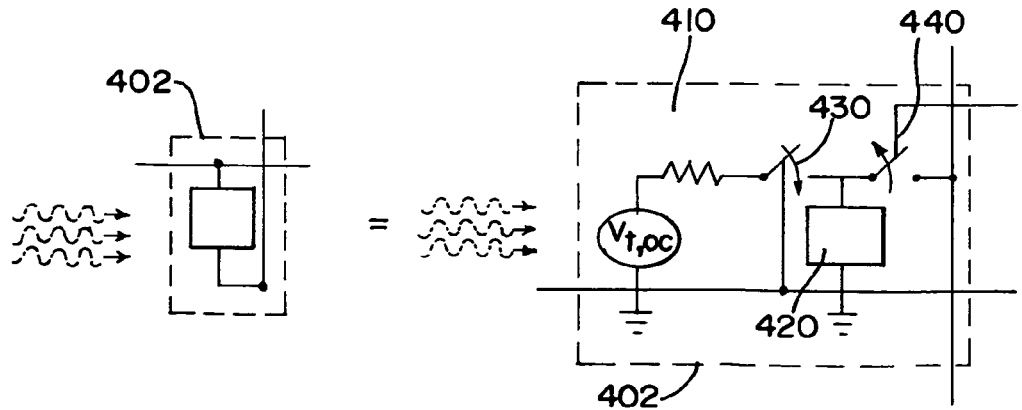

In a further preferred embodiment, a detector 400 comprising a two dimensional array of pixels 402 is described, as shown in FIG. 14a. An electronic scheme of a single pixel structure 402 of a 2D array is illustrated in FIG. 14b. Although the invention is not limited thereto, the 2D-array may consist of n rows and m columns. Each pixel 402 generates its own voltage $V_{t,oc}$ according to its optical input. Each pixel may be separately addressable so as to be able to read out the value on each pixel independently. Accordingly, a means for separately addressing each pixel and a means to read out the value on each pixel independently is provided. Due to the finite dimensions of the metal contact to the pixel a local resistance 410 is present. During a given time period all pixels of the array store their input values in a storage element 420 by means of switch 430. The storage element 420 may be e.g. a capacitor, The read_switch 430 of each pixel is activated by a common read_signal which is directed to every pixel during the read period. Before the optical pulse is incident, every switch 430 of each pixel element is activated by a read_signal. During the read_period all read_switches remain conductive and all read_out switches remain open, i.e. in a non conductive state. After the laser pulse reading cycle is terminated, every switch 430 of each pixel is deactivated. Afterwards the read_out cycle is started. During the read_out cycle each row comprising M columns of the 2D pixel array, is step by step addressed by activating the M column_pixel switches 440 to read out the information from the storage element. When N rows of pixels are available N different read_out steps are executed in series during a total frame period. Other ways of read-out steps are not limiting for the scope of the present invention and well known by a person skilled in the art.

Figure 15:
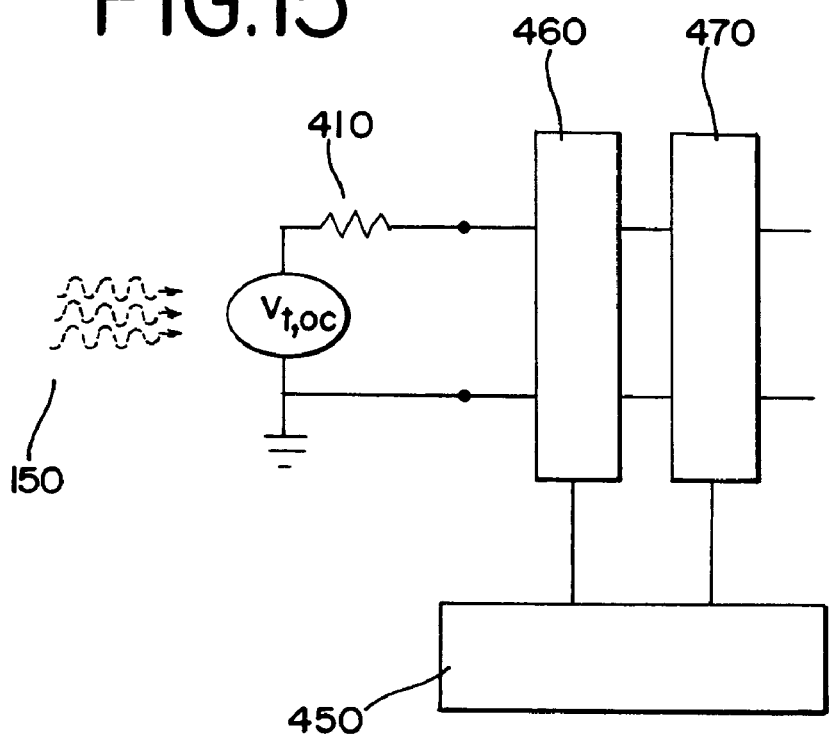
FIG. 15 shows a block diagram of a read-out scheme for a detector system according to an embodiment of the present invention.
Figure 16:
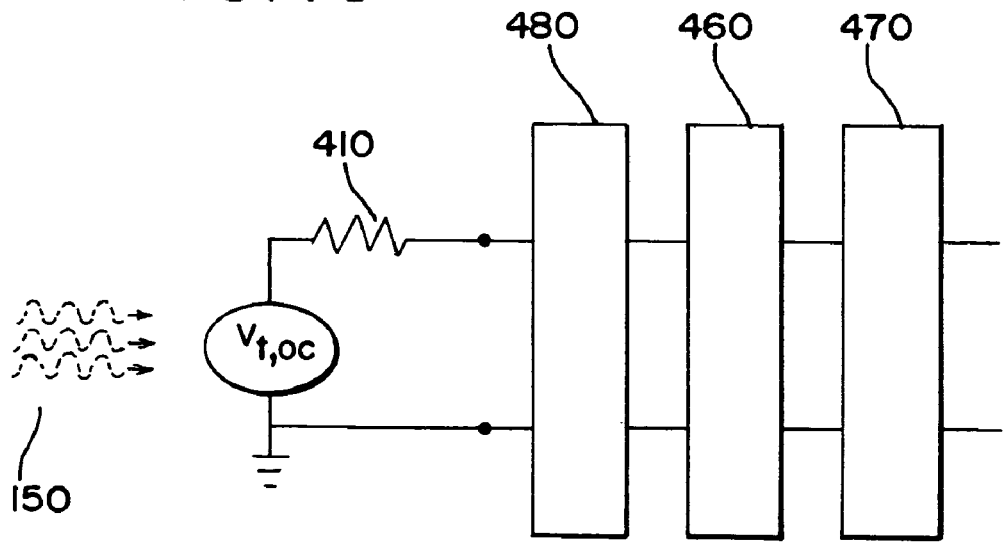
FIG. 16 shows a block diagram of an alternative read-out scheme for a detector system according to an embodiment of the present invention.

The read-out electronics for detecting devices comprising detector elements as described in any of the previous embodiments are now further described in more detail. FIG. 15 and FIG. 16 show preferred configurations of the block diagrams of the read-out electronics for detecting devices. The read-out electronics can be applied for every pixel described above in accordance with the present invention. The electronic scheme of FIG. 15 is suitable for the digitalisation of the temporal evolution of the beam characteristics. The clock 450 triggers in a regular way the Sample/Hold circuitry 460 where after the Analogue/Digital 470 conversion can take place. The Sample&Hold circuitry 460 can be any circuitry that allows obtaining a measurement result and storing it, as described in FIG. 10b. The Sample&Hold circuitry 460 comprises a storage element, which can be any type of storage element such as e.g. a capacitor. Once the signal is digitized it can be used for further processing for the reconstruction of the temporal shape of the laser beam. The electronic scheme of FIG. 16 is rather suited for measuring the maximum signal at the pixel output. The peak detector circuitry 480 records the maximum value of the temporal evolution of the laser beam incident in the particular pixel. At the moment the maximum signal is detected the Sample and Hold circuitry 460 is triggered. After this process the digitalisation of the analogue signal can be effectuated by means of the ADC circuitry 470. The above described read-out electronics can be made of are standard electronic components, well known by a person skilled in the art.

Figure 17:
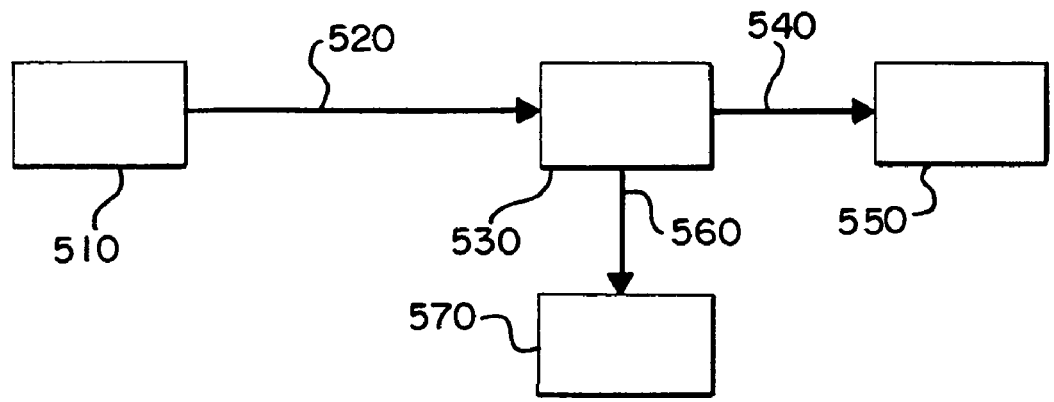
FIG. 17 shows a possible setup of a beam sampling system according to an embodiment of the present invention.
Figure 18:
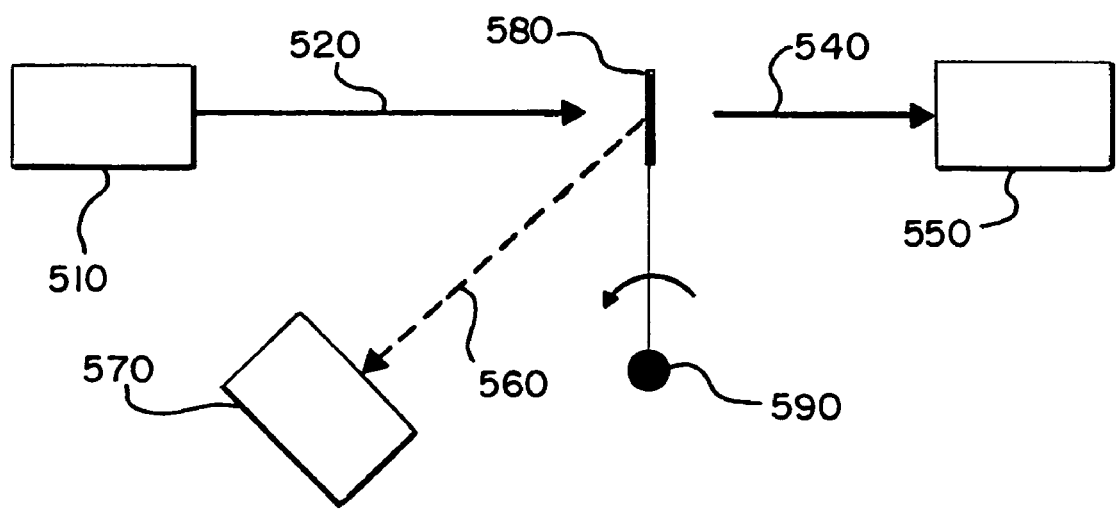
FIG. 18 shows an alternative setup of a beam sampling system according to an embodiment of the present invention.

A further embodiment describes methods for measuring a temporal and spatial profile of a laser beam according to the present invention. Schematical illustrations are shown in FIG. 17 and FIG. 18. FIG. 17 illustrates a first preferred configuration, wherein a system for generating an irradiation beam 510, e.g. a laser system 510, generates a first irradiation beam 520, sampled, by a suitable beam sampler 530. The method and system is especially useful for high power laser systems such as e.g. a Nd:YAG or a CO$_2$ laser, and splits the first light beam 520 into a second light beam 540 and a third light beam 560. The optical power in the second light beam 540 is much larger than the optical power in the third light beam 560. The beam sampler 530 can be e.g. a low absorptive beam splitter suited for high energy beams like e.g. an appropriate coated ZnSe beam splitter a leaking mirror or an acousto-optic beam splitter . . . The second light beam 540 is used for the specific application 550 of the user. This may be one application or the second light beam 540 may be split further for several other applications. The third light beam 560 is used as input for a detector or camera 570 which is used to inform about the status of the beam 520 emitted by the laser 510. The detector or camera 570 may comprise one or a plurality of any of the detector elements as described in the previous embodiments. This information about the status may comprise temporal and spatial information about the output of the laser system 510, and indirectly about the temporal behaviour of the first light beam 520 profile.

In a second preferred configuration the beam sampler 530 is replaced by a mirror 580 which is attached to a rotating point 590. The mirror 580 is installed such that at a given moment in time input beam 520 is reflected towards the 1D or 2D camera system 570. Also in the present configuration, the detector or system 570 comprises one or a plurality of any of the detector elements as described in the previous embodiments The mirror rotation is only actuated from time to time such that the interruption of the input beam 520 for the user application 550 is only very limited. This embodiment is especially useful for continuous working lasers. For pulsed laser systems, the timing of rotation of the mirror 580 can be adapted to the timing of the laser pulses so as to synchronise with the pulse frequency.

For high power laser systems, the fraction of the laser beam that is guided towards the camera is limited preferably to some percentage. In the case of pixels of 25 μm radius pixels, a GaAs substrate detector, the substrate temperature should be limited under the 800 K.

It is to be understood that although preferred embodiments, specific constructions and configurations, as well as materials, have been discussed herein for devices according to the present invention, various changes or modifications in form and detail may be made without departing from the scope and spirit of this invention.

The invention claimed is:

1. A detector for characterising a high power light beam, said detector comprising at least one pixel, wherein each of said at least one pixel comprising a doped semiconductor substrate adapted to substantially absorb an incident light beam, being at least a fraction of said high power light beam, over a penetration depth $L_{abs}$, said semiconductor substrate having thermoelectric properties means for measuring an electrical signal induced by a thermoelectric effect in said doped semiconductor substrate, said means partly covering the doped semiconductor substrate such that a window opening is provided at a first side of said doped semiconductor substrate for receipt of said incident light beam in said doped semiconductor substrate and said means furthermore comprising a first electrode at said first side of said doped semiconductor substrate and a reference electrode, positioned outside an absorption volume determined by said window opening and said penetration depth $L_{abs}$.

2. The detector according to claim 1, wherein the means for partly covering the doped semiconductor substrate and said penetration depth $L_{abs}$ are adjusted so that $$\frac{P_{pixel} \cdot L_{abs}}{S_{pixel}}$$

is in the range 0.1 to 100 wherein $P_{pixel}$ is the perimeter of the pixel window and $S_{pixel}$ is the surface area of the pixel window.

3. A detector according to claim 1, said characterising being detecting any of a spatial intensity profile, a spatial energy profile, a spatial energy density profile or a spatial power profile of the beam.

4. A detector according to claim 1 wherein said first electrode defines at least the perimeter of the window opening.

5. A detector according to claim 4, wherein said first electrode furthermore comprises at least one elongate electrode extending over the window opening.

6. A detector according to claim 1 wherein said first electrode is separated at least partly from said doped semiconductor substrate by means of an insulating layer.

7. A detector according to claim 1, said first electrode furthermore comprising a conductor line and a bonding pad, deposited on top of said insulating layer.

8. A detector according to claim 1, wherein a reflective top layer is provided outside said window opening.

9. A detector according to claim 2 wherein the adjustment of the penetration depth $L_{abs}$ is performed by adjusting the doping level of said doped semiconductor substrate.

10. A detector according to claim 1, comprising a plurality of pixels, each pixel having a pixel window with an average pixel window width w, the pixels being separated by at least an interpixel pitch P, wherein said interpixel pitch P is between 1 and 10 times the average pixel window width w.

11. A detector according to claim 10, comprising a means for reducing the cross-talk between neighbouring pixels of said plurality of pixels adapted for reducing the cross-talk at least below a 5% acceptance level.

12. A detector according to claim 11, wherein between at least two of said plurality of pixels a cooling channel is provided.

13. A detector according to claim 12, wherein said cooling channel has a depth which is at least 15%, of the penetration depth $L_{abs}$.

14. A detector according to claim 1, wherein operation of said detector can be selected between an intensity measuring mode, for measuring the intensity of a light beam, an energy measuring mode, for measuring the energy of a light beam and a power measuring mode, for measuring the power of a light beam by adjusting the penetration depth $L_{abs}$ and the window opening used.

15. A detector according to claim 1, wherein at each first electrode a switch and a storage means is provided, for temporary storing the pixel information.

16. A detector according to claim 1, wherein said detector system furthermore comprises a read-out electronic circuitry adjusted to sample at regular moments the time evolution of the electrical detector outputs and convert the sampled analog voltages into digital signals.

17. A detector according to claim 16, wherein said read-out electronic circuitry is adjusted for detecting the maxima in time of the detector outputs and convert these sampled analog voltages into digital signals.

18. A detector according to claim 1, wherein said second electrode is positioned at a second side of the doped semiconductor substrate, the first and second side being opposite with respect to each other.

19. A system for monitoring the output of a light beam producing means comprising a light beam sampling means and a detector, whereby said light beam sampling means is adjusted to split the light beam in a first small fraction and a second large fraction, whereby said first small fraction of said light beam is directed towards a detector according to claim 1.

20. A system for monitoring according to claim 19, wherein said beam sampling means is a mirror, said mirror being rotatably mounted as to split the light beam at regular periods.

21. A detector according to claim 1, comprising a plurality of pixels, each pixel having a pixel window with an average pixel window width w, the pixels being separated by at least an interpixel pitch P, wherein said interpixel pitch P is between 1.5 and 8 times the average pixel window width.

22. A detector according to claim 1, comprising a plurality of pixels, each pixel having a pixel window with an average pixel window width w, the pixels being separated by at least an interpixel pitch P, wherein said interpixel pitch P is between 1.5 and 4 times the average pixel window width.

23. A detector according to the previous claim 13, wherein said cooling channel has a depth which is at least 25% of the penetration depth $L_{abs}$.

24. A detector according to claim 23, wherein said cooling channel has a depth which is at least 50% of the penetration depth $L_{abs}$.

* * * * *